(12) United States Patent
Toombs et al.

(10) Patent No.: US 12,529,961 B2
(45) Date of Patent: Jan. 20, 2026

(54) ROLL-TO-ROLL BASED 3D PRINTING THROUGH COMPUTED AXIAL LITHOGRAPHY

(71) Applicant: The Regents of the University of California, Oakland, CA (US)

(72) Inventors: Joseph Toombs, Oakland, CA (US); Hayden Taylor, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 146 days.

(21) Appl. No.: 18/271,104

(22) PCT Filed: Feb. 22, 2022

(86) PCT No.: PCT/US2022/017325
§ 371 (c)(1),
(2) Date: Jul. 6, 2023

(87) PCT Pub. No.: WO2022/178426
PCT Pub. Date: Aug. 25, 2022

(65) Prior Publication Data
US 2024/0012330 A1    Jan. 11, 2024

Related U.S. Application Data

(60) Provisional application No. 63/151,778, filed on Feb. 21, 2021.

(51) Int. Cl.
G03F 7/30    (2006.01)
G03F 7/00    (2006.01)

(52) U.S. Cl.
CPC ............ *G03F 7/30* (2013.01); *G03F 7/70191* (2013.01); *G03F 7/70733* (2013.01)

(58) Field of Classification Search
CPC .... G03F 7/30; G03F 7/70191; G03F 7/70733; G03F 7/2057; G03F 7/24; G03F 7/0037
See application file for complete search history.

(56) References Cited

U.S. PATENT DOCUMENTS 6,906,779 B2 * 6/2005 Chan-Park .............. G02F 1/167
355/75
9,177,861 B1   11/2015 Park et al.
(Continued)

*Primary Examiner* — Hung V Nguyen
(74) *Attorney, Agent, or Firm* — Venable LLP; Henry J. Daley; Ryan T. Ward

(57) ABSTRACT

A roll-to-roll computed axial lithography system includes an optical illumination system; an optical modulation system to receive light from the optical illumination system and to output an illumination pattern of light; and a web-handling system to receive and transport a web having a photosensitive material layer such that a portion of the web will be in an optical path of the modulation system. The web-handling system includes a development module to render three-dimensional structures from the layer exposed to the illumination pattern of light. The illumination pattern of light provides predetermined three-dimensional regions within a bulk of the layer that are exposed beyond a photo-responsive threshold for the photosensitive material providing volumetric patterning. The development module removes one of regions of the layer exposed beyond the photo-responsive threshold or regions of the layer that are not exposed beyond the photo-responsive threshold to provide a three-dimensional structure from the layer.

18 Claims, 24 Drawing Sheets

(56) References Cited

U.S. PATENT DOCUMENTS

| | | | |
|---|---|---|---|
| 9,305,648 B2* | 4/2016 | Nguyen | G11C 16/3427 |
| 9,581,640 B2* | 2/2017 | Zeise | G01R 31/2891 |
| 2009/0130607 A1 | 5/2009 | Slafer | |
| 2010/0294749 A1 | 11/2010 | Kempe et al. | |
| 2015/0022790 A1 | 1/2015 | Johnson et al. | |
| 2016/0284515 A1 | 9/2016 | Slafer | |
| 2018/0072045 A1 | 3/2018 | Kosalla et al. | |

* cited by examiner

ROLL-TO-ROLL BASED 3D PRINTING THROUGH COMPUTED AXIAL LITHOGRAPHY

CROSS REFERENCE TO RELATED APPLICATION

The present application is a U.S. National Stage of PCT/US2022/017325, filed Feb. 22, 2022, which claims priority benefit from U.S. Provisional Patent Application No. 63/151,778, filed on Feb. 21, 2021, the entire contents of which are incorporated herein by reference.

GOVERNMENT LICENSE RIGHTS TO CONTRACTOR-OWNED INVENTIONS MADE UNDER FEDERALLY SPONSORED RESEARCH AND DEVELOPMENT

This invention was made with government support under grant number 1160494 awarded by the National Science Foundation (NSF). The government has certain rights in the invention.

BACKGROUND

1. Technical Field

The field of currently claimed embodiments relate to three-dimensional printing, and more particularly to systems and methods for three-dimensional printing through computed axial lithography.

2. Discussion of Related Art

Currently, computed axial lithography is used to print individual three-dimensional objects within a container of photosensitive material. However, there remains a need for producing three dimensional objects in other ways with other systems.

SUMMARY

An aspect of the present invention is to provide a roll-to-roll (R2R) computed axial lithography system. The R2R system includes an optical illumination system; an optical modulation system arranged to receive light from the optical illumination system and being further configured to output a spatially and temporally modulated illumination pattern of light; and a web-handling system configured to receive and transport a web such that a portion of the web will be in an optical path of the modulation system at an instant of time during operation, the web including a layer of photosensitive material. The web-handling system includes a development module arranged to render three-dimensional structures from the layer of photosensitive material that has been exposed to the spatially and temporally modulated illumination pattern of light. The spatially and temporally modulated illumination pattern of light provides predetermined three-dimensional regions within a bulk of the layer of photosensitive material that are exposed beyond a photo-responsive threshold for the photosensitive material providing volumetric patterning. The development module removes one of regions of the layer of the photosensitive material that are exposed beyond the photo-responsive threshold or regions of the layer of photosensitive material that are not exposed beyond the photo-responsive threshold to provide a three-dimensional structure from the layer of the photosensitive material.

In an embodiment, the development module includes a liquid processing system to at least one of rinse or spray the layer of photosensitive material with a developer solvent.

In an embodiment, the development module includes a heating system to apply heat to the layer of photosensitive material after being exposed to the spatially and temporally modulated illumination pattern of light.

In an embodiment, the web-handling system further includes a coating module configured to deposit a layer of photosensitive material onto a flexible substrate.

In an embodiment, the optical illumination system includes a single laser, and the optical modulation system includes an array of electromechanically switchable micromirrors.

In an embodiment, the optical illumination system further includes a square core multimode fiber arranged such that light from the laser is coupled therein, the square core multimode fiber providing spatially homogenized output light.

In an embodiment, the optical illumination system further includes a beam expanding lens system arranged between a light output end of the square core multimode fiber and the optical modulation system.

In an embodiment, the array of electromechanically switchable micromirrors are pulse width modulated, and the array of electromechanically switchable micromirrors have a refresh rate set in accordance with a speed of the web passing through the roller assembly.

In an embodiment, the R2R system further includes an optical imaging system arranged between the optical modulation system and the roller assembly, wherein the optical imaging system is constructed to compensate for the layer of the photosensitive material forming a curved imaging surface rather than a flat imaging plane.

In an embodiment, the optical imaging system includes (a) a mirror arranged to reflect the spatially and temporally modulated illumination pattern of light; (b) a telecentric scanning lens system arranged to receive the reflected spatially and temporally modulated illumination pattern of light to be output to provide the volumetric patterning of the layer of photosensitive material; and (c) a fluid container having a transparent and substantially planar surface through which the reflected spatially and temporally modulated illumination pattern of light output from the telecentric scanning lens system. The fluid container is configured to hold a fluid with an index of refraction that is substantially matched to an index of refraction of the layer of photosensitive material. The fluid container is further configured to immerse the portion of the web in the fluid during the volumetric patterning. The telecentric scanning lens system includes an electrically tunable lens and a galvanometric mirror.

In an embodiment, the optical illumination system includes a plurality of lasers, each arranged at different angles such that the optical modulation system can project spatially offset exposure patterns onto the layer of photosensitive material.

In an embodiment, the three-dimensional structure has submillimeter lithographically produced substructures.

In an embodiment, the three-dimensional structure has lithographically produced substructures that are less than 100 micrometers.

In an embodiment, the three-dimensional structure has lithographically produced substructures that are less than 10 micrometers.

Another aspect of the present invention is to provide a roll-to-roll computed axial lithography method. The method includes providing a spatially and temporally modulated illumination pattern of light; passing a web through the temporally modulated illumination pattern of light to expose a layer of photosensitive material of the web; and developing the exposed layer of photosensitive material subsequent to the passing through the temporally modulated illumination pattern of light to render three dimensional structures from the layer of photosensitive material.

In an embodiment, the three-dimensional structure has submillimeter lithographically produced substructures.

In an embodiment, the three-dimensional structure has lithographically produced substructures that are less than 100 micrometers.

In an embodiment, the three-dimensional structure has lithographically produced substructures that are less than 10 micrometers.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
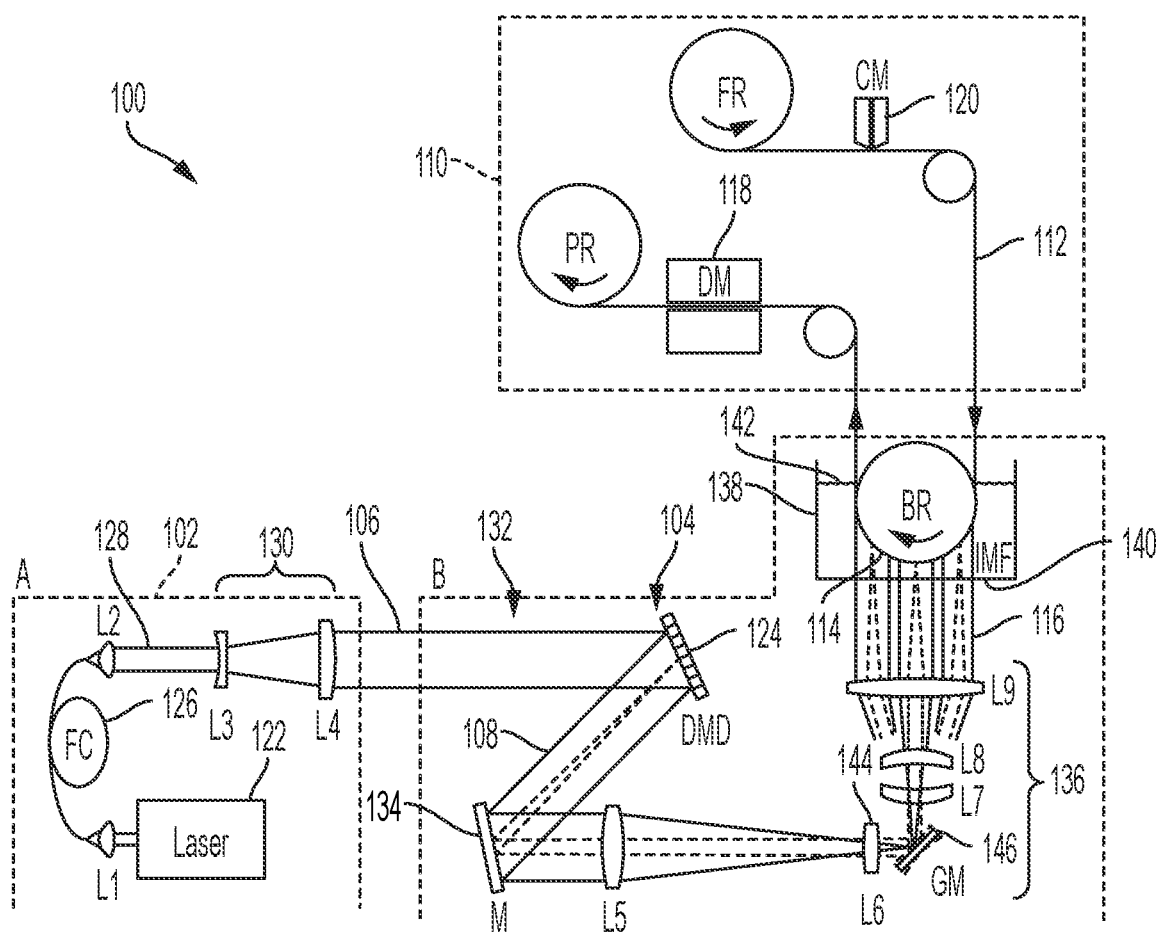
FIG. 1 is a schematic illustration of a roll-to-roll computed axial lithography system 100, according to an embodiment of the current invention.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed, and other methods developed without departing from the broad concepts of the present invention. All references cited anywhere in this specification are incorporated by reference as if each had been individually incorporated.

The term "light", and related terms such as optical, are intended to have a broad meaning to include both visible and non-visible portions of the electromagnetic spectrum. For example, "light" can include infrared light and ultraviolet light in addition to including visible light.

The term "web" is intended to have a broad meaning that can include a flexible substrate in addition to layers of flexible material disposed on the substrate. For example, in some embodiments a "web" can include a flexible substrate, such as, but not limited to, paper, a thin metal sheet, a solid polymer sheet, etc. A web can also include one or more layers of photosensitive material disposed on the substrate in which the one or more layers of photosensitive material is a solid or a gel. In some embodiments, the web can include one or more sacrificial layers between the substrate and the one or more layers of photosensitive material, or even interweaved between the substrate and multiple layers of photosensitive material in various arrangements without limitation. The web can be many different dimensions, without limitation. For example, the web can measure a few centimeters by a few centimeters in some embodiments. In other embodiments, the web can measure a meter or more wide and many meters long, for example. However, the concepts of the invention are not limited to webs of particular dimensions.

The term "roll-to-roll" is intended to refer to a web that can be unrolled from one roller, possibly onto a second roller, across one or more intermediary rollers.

Some embodiments of the current invention are related to the systems and methods for performing continuous 3D roll-based additive manufacturing. A photosensitive material coated onto a flexible substrate (web) is passed over a precision driven roller completing a full 180-degree reversal in direction. Time multiplexed light intensity patterns are projected onto the material passing over the roller face, such that upon complete traversal over the roller the 3D light dose within the material coating surpasses the material dose threshold to cause photopolymerization only in select regions.

Although the embodiments discussed in detail herein relate to photosensitive materials being exposed with photons, other embodiments can also include exposing other materials that can be exposed by electrons and/or charged particles, for example.

Some embodiments of the current invention are different from those described in prior art because the photopolymer is not confined within a transparent container, instead it is coated on the web substrate and patterned in a solid or gel state, for example. Other embodiments could include liquid photosensitive materials if it has high enough viscosity and/or the web is wetted sufficiently strongly so that it can cling to the web long enough to be exposed and selectively crosslinked before being developed. Or, there could be a liquid, solid or gel photosensitive material covered with a protective layer that is transparent to the illumination light, for example.

Some embodiments of this invention are also distinct from roll-based micro/nanomanufacturing methods such as imprint lithography, gravure printing, and photo-roll lithography because it can enable production of high aspect ratio reentrant features and voids in a single step that are difficult or even impossible with the existing methods. Some embodiments of the current invention can have applications in mechanical metamaterials, microfluidics, 3D tissue culturing, and desalination, for example. Specifically, let the roller's axis of rotation be the 'z' axis and the optical projection system's axis (the direction of light propagation) be the 'r' axis. While the materiel is in contact with the roller, an elemental unit of material is subject to light exposure from an arc subtending an angle less than or equal to 180 degrees. During this time, the light intensity is modulated to achieve the desired 3D light dose within the material coating. The Fourier slice theorem implies larger frequency coverage is gained by increasing the angular coverage of projections in the spatial domain. Thus, in order to achieve full geometric flexibility, the range of angular coverage should be maximized (as close to 180 degrees as possible). To extend the total patternable area, exposure patterns can be spatially multiplexed along the z-axis of the roller by optical scanning or by an array of exposure optical units.

Several optical configurations for the system are possible, including some with spatial multiplexing. In the one configuration, the amplitude spatial light modulator (SLM), which is an array of rapidly switching micromirrors, is illuminated with a low divergence laser source and imaged onto the face of the roller such that the image's extent matches the diameter of the roller plus two thicknesses of the photopolymer-web combination.

In this embodiment, each micromirror on the SLM is pulse-width modulated (PWM) such that the projected light intensity images are equivalent to the computationally generated images. The refresh rate of the SLM is synchronized to the rotation velocity of the roller. The controlled sequential projection provides sufficient dose to the material to selectively polymerize design geometries.

In another configuration, the spatial light modulator is illuminated with a linear array of two or more lasers from different angles such that the image of the SLM can be projected spatially offset from one another on the roller face. The lasers may simultaneously illuminate the SLM, creating replicate images on the roller face equal to the number of lasers. In this way, marry regions along the z-axis (or longitudinal axis) of the roller could be exposed simultaneously to the same pattern generating an array of fabricated objects.

Alternatively, the lasers may illuminate the SLM at different times synchronized to the rate of changing masks on the SLM such that multiple distinct images can be projected. In this way, many regions along the r-axis (or across the face of the roller perpendicular to the z-axis) could be illuminated with different patterns. The demagnification of these patterns could be larger than the first configuration, meaning the area exposed by an individual pattern is smaller, because multiple patterns illuminate the material as it passes over the roller as opposed to just one. Spatial bandwidth product could be improved this way as the projected pixels size is decreased but the spatial extent of the patternable area remains as large as the face of the roller.

In another configuration, the previous two multiplexed systems in the second-mentioned configuration could be used together. A single group of lasers is activated simultaneously to project replicate patterns along the z-axis of the roller (longitudinally). Additionally, groups of lasers can be activated sequentially to project temporally multiplexed patterns over the face of the roller (laterally).

In yet further embodiments, a roller that is transparent to the illumination radiation (e.g., light) can be used along with appropriate optical components to allow irradiation of the remaining 180 degrees of the portion of the web that is in contact with the roller either in addition to or instead of the previously mentioned illumination systems.

FIG. 1 is a schematic illustration of an embodiment of the current invention that we'll describe in more detail to help explain some of the concepts of some embodiments of the current invention. The detailed examples of structural components in FIG. 1 are the following:

A—Light preconditioning

Laser focuses into square core multimode optical fiber cable (FC)

L2 collimates from FC and L3 and L4 expand the beam

B—Spatial light modulation

Digital micromirror device (DMD) imparts an amplitude modulation on the incident flat top beam.

Mirror (M) reflects light into telecentric scanning lens system (L5-L9).

L6, an electrically tunable lens, scans the axial focus of the system.

Galvonometer mirror (GM) scans the image of the DMD diametrically across the backing roller (BR).

Index matching fluid (IMF) minimizes refraction at the photoresist interface such that angular range is maximized.

C—Web handling

Feedstock roller (FR) unrolls a bare polymeric backing sheet.

Coating module (CM) deposits a layer of photoresist, negative or positive.

Web passes over backing roller (BR) where the photoresist is volumetrically patterned.

Development module (DM) renders the 3D structures by rinsing or spraying with solvent developer.

Web is uptaken by pickup roller (PR).

Note, however, that this is a specific example to facilitate description of some concepts of the invention and is not to be understood as limiting the general concepts of the invention. FIG. 1 will also be used as follows to describe further concepts of the current invention.

FIG. 1 is a schematic illustration of a roll-to-roll computed axial lithography system 100 according to an embodiment of the current invention. The roll-to-roll computed axial lithography system 100 includes an optical illumination system 102, an optical modulation system 104 arranged to receive light 106 from the optical illumination system 102 and being further configured to output a spatially and temporally modulated illumination pattern of light 108. The roll-to-roll computed axial lithography system 100 also includes a web-handling system 110 configured to receive and transport a web 112 such that a portion of the web 114 will be in an optical path 116 of the modulation system 104 at an instant of time during operation, the web including a layer of photosensitive material.

The web-handling system 110 includes a development module (DM) 118 arranged to render three-dimensional structures from the layer of photosensitive material that has been exposed to the spatially and temporally modulated illumination pattern of light 108. The spatially and temporally modulated illumination pattern of light 108 provides predetermined three-dimensional regions within a bulk of the layer of photosensitive material that are exposed beyond a photo-responsive threshold for the photosensitive material providing volumetric patterning, and the development module 118 removes one of regions of the layer of the photosensitive material that are exposed beyond the photo-responsive threshold or regions of the layer of photosensitive material that are not exposed beyond the photo-responsive threshold to provide a three-dimensional structure from the layer of the photosensitive material.

In some embodiments, the development module 118 includes a liquid processing system (not specifically shown in FIG. 1) to at least one of rinse or spray the layer of photosensitive material with a developer solvent. In some embodiments, the development module 118 includes a heating system (not specifically shown in FIG. 1) to apply heat to the layer of photosensitive material after being exposed to the spatially and temporally modulated illumination pattern of light.

In some embodiments, heat can be used for subliming un-crosslinked material which may not necessarily involve liquids in the postprocessing. Other embodiments can include printing of materials such as ceramics where particles are dispersed in the photosensitive medium and later sintered after driving off the cured photosensitive medium.

In some embodiments, the web-handling system 110 further includes a coating module 120 configured to deposit a layer of photosensitive material onto a flexible substrate.

In some embodiments, the optical illumination system 102 includes a single laser 122, and the optical modulation system 104 includes an array of electromechanically switchable micromirrors 124. Although not shown in FIG. 1, the optical modulation system 104 can also include a processor system and data storage such as but not limited to a computer system to provide computed axial lithography commands to the electromechanically switchable micromirrors 124 that take into account the structure of the roll-to-roll computed axial lithography system 100 and the desired three-dimensional structures to be produced.

Alternative embodiments could use a solid-state (e.g., liquid crystal) spatial light modulator, excluding digital micromirror devices which have a mechanical component to them, for example.

In some embodiments, the optical illumination system 102 further includes a square core multimode fiber 126 arranged such that light from the laser is coupled into it. The square core multimode fiber 126 provides spatially homogenized output light 128. Although a square core multimode fiber 126 is used in this embodiment, other multimode fibers could be used in alternative embodiments. This helps remove speckle from the laser illumination, so other optical components could also be used instead, or even no optical component is the normal laser speckle is not a problem for the particular application.

In some embodiments, the optical illumination system 102 further includes a beam expanding lens system 130 arranged between a light output end 128 of the square core multimode fiber 126 and the optical modulation system 104. In other words, the beam 128 is expanded to beam 106.

In some embodiments, the array of electromechanically switchable micromirrors 124 are pulse width modulated. In some embodiments, the array of electromechanically switchable micromirrors 124 have a refresh rate set in accordance with a speed of the web 112 passing through the web-handling system 110.

In some embodiments, the roll-to-roll computed axial lithography system 100 further includes an optical imaging system 132 arranged between the optical modulation system 104 and the web-handling system 110, wherein the optical imaging system 132 is constructed to compensate for the layer of the photosensitive material forming a curved imaging surface 114 rather than a flat imaging plane. In some embodiments, the optical imaging system 132 includes a mirror 134 arranged to reflect the spatially and temporally modulated illumination pattern of light 108, a telecentric scanning lens system 136 arranged to receive the reflected spatially and temporally modulated illumination pattern of light to be output to provide the volumetric patterning of the layer of photosensitive material; and a fluid container 138 having a transparent and substantially planar surface 140 through which the reflected spatially and temporally modulated illumination pattern of light output from the telecentric scanning lens system 136. The fluid container 138 is configured to hold a fluid 142 with an index of refraction that is substantially matched to an index of refraction of the layer of photosensitive material. The fluid container 138 is further configured to immerse the portion of the web 114 in the fluid 142 during the volumetric patterning. The telecentric scanning lens system 136 includes an electrically tunable lens 144 and a galvanometric mirror 146.

The optical imaging system 132 is just one example according to some embodiments of this invention. Other examples are providing in this specification. The general concepts of the current invention are not limited to these particular examples.

In some embodiments, the optical illumination system 102 includes a plurality of lasers, each arranged at different angles such that the optical modulation system 104 can project spatially offset exposure patterns onto the layer of photosensitive material.

In some embodiments, multiple lasers could be used in which they are not arranged at different angles in absolute space. They could, for example, point in the same direction and be offset in position, to illuminate different regions across the width of the web, or provide different illumination angles into the photosensitive medium by virtue of the rotation of the web rather than variation of the absolute propagation direction of the beams.

In some embodiments, the roll-to-roll computed axial lithography system 100 can be constructed to lithographically produce three-dimensional structures that have submillimeter lithographically produced substructures. In some embodiments, the roll-to-roll computed axial lithography system 100 can be constructed to lithographically produce three-dimensional structures that have lithographically produced substructures less than 100 micrometers. In some embodiments, the roll-to-roll computed axial lithography system 100 can be constructed to lithographically produce three-dimensional structures that have lithographically produced substructures less than 10 micrometers. The lower limit in structure features depends on the smallest resolution of the particular lithographic system. For example, with extreme ultraviolet patterning, the substructures can be on the order of 10 nanometers.

Other embodiments of the current invention are directed to roll-to-roll computed axial lithography methods. Such methods according to some embodiments include providing a spatially and temporally modulated illumination pattern of light; passing a web through the temporally modulated illumination pattern of light to expose a layer of photosensitive material of the web; and developing the exposed layer of photosensitive material subsequent to the passing through the temporally modulated illumination pattern of light to render three dimensional structures from the layer of photosensitive material.

Figure 2A:
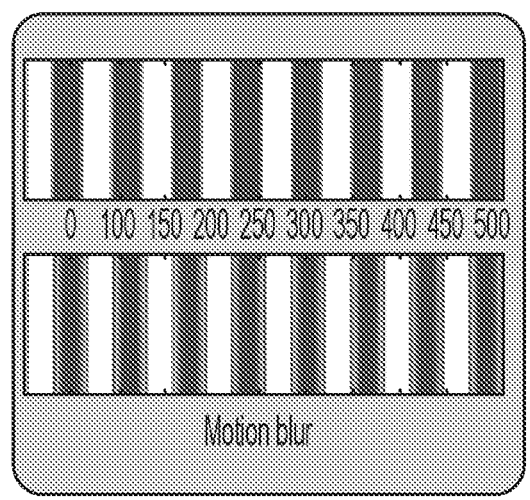
FIGS. 2A-2C depict a modulation transfer function (MTF) of the optical modulation system 104, according to an embodiment of the present invention.
Figure 2B:
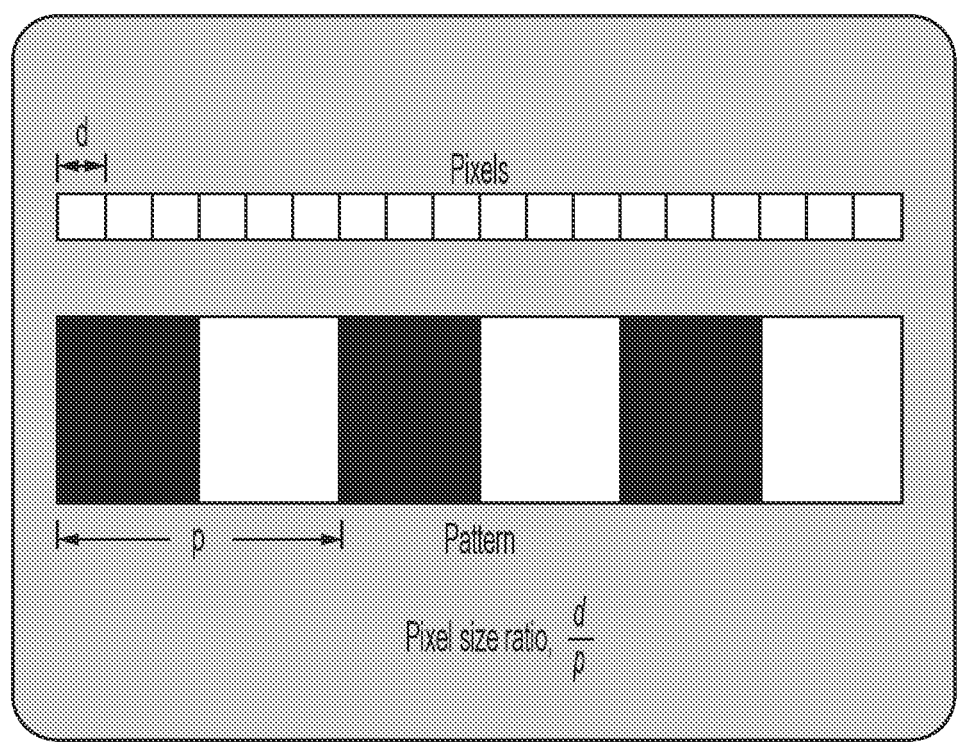
Figure 2C:
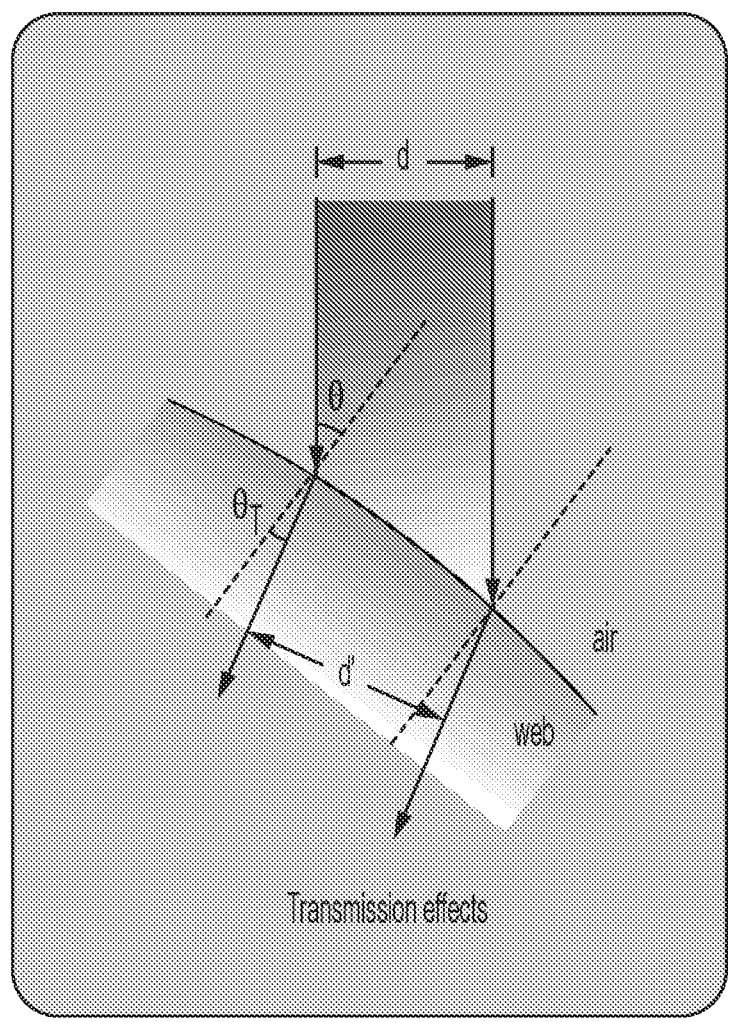

FIGS. 2A-2C depict a modulation transfer function (MTF) of the optical modulation system 104, according to an embodiment of the present invention. The MTF describes the ability of an (optical) system to transfer a signal of certain frequency. In roll-to-roll computed axial lithography, the MTF is expected to degrade due several effects including motion blur, minimum addressable optical spot size compared to printed feature size, scattering and transmission effects in the photosensitive material. The optical system may also degrade the MTF of the system. For example, FIG. 2A depicts a possible degrading effect such as motion blur. FIG. 2B depicts a patterning effect with a size of pixels. FIG. 2C depicts transmission effects through the web creating a refraction effect.

Figure 3:
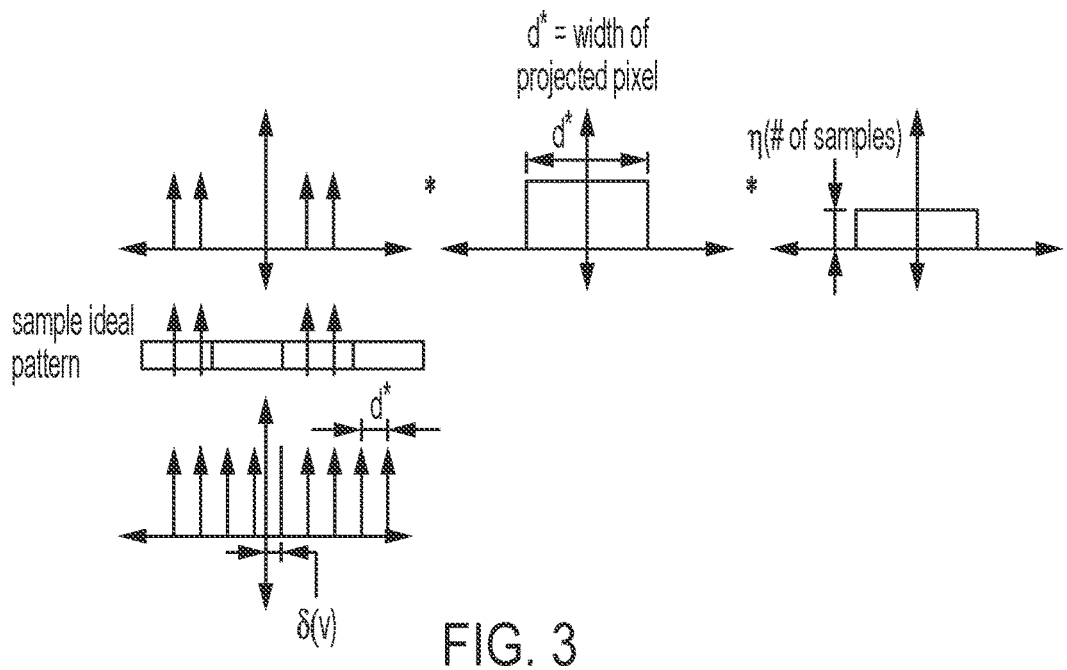
FIG. 3 depicts a motion blur due to motion of the photosensitive material, according to an embodiment of the present invention.

FIG. 3 depicts a motion blur due to motion of the photosensitive material, according to an embodiment of the present invention. The photosensitive material is expected to be in constant motion during light exposure. Because the patterned illumination has limited refresh rate, the light dose in the photosensitive material will be a blurred version of the intended pattern.

Figure 4A:
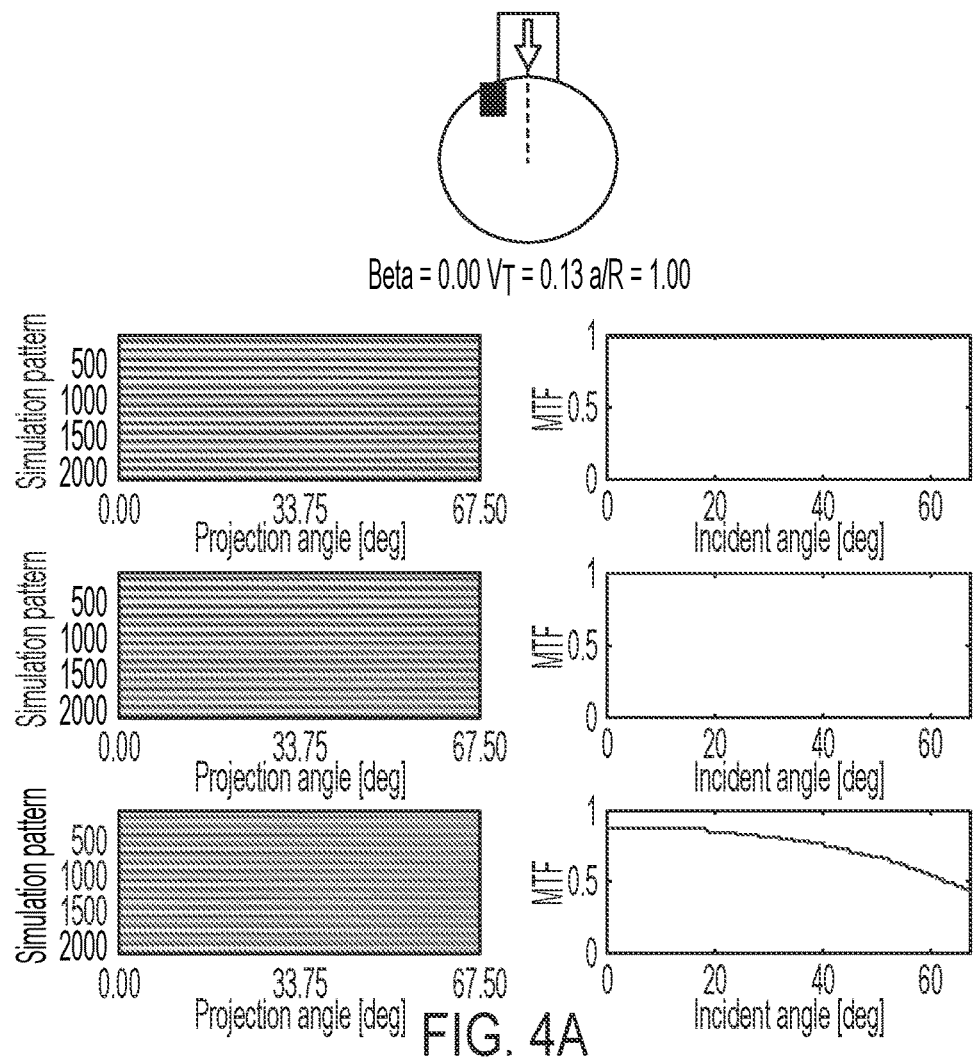
FIGS. 4A-4C depict a dose pattern and influence on the MTF, according to an embodiment of the present invention.
Figure 4B:
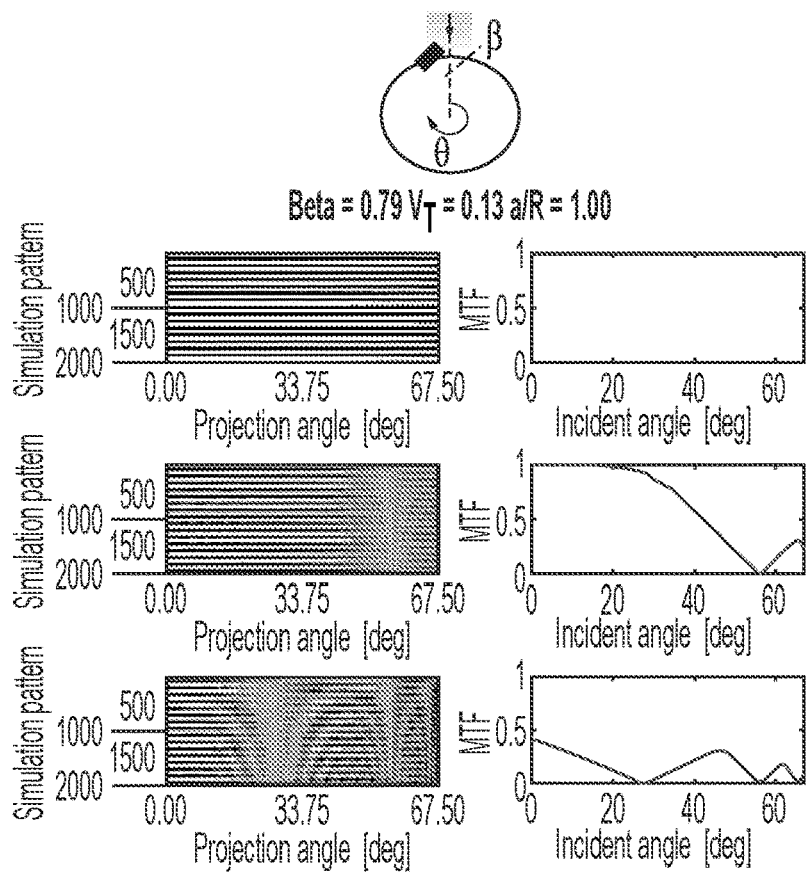
Figure 4C:
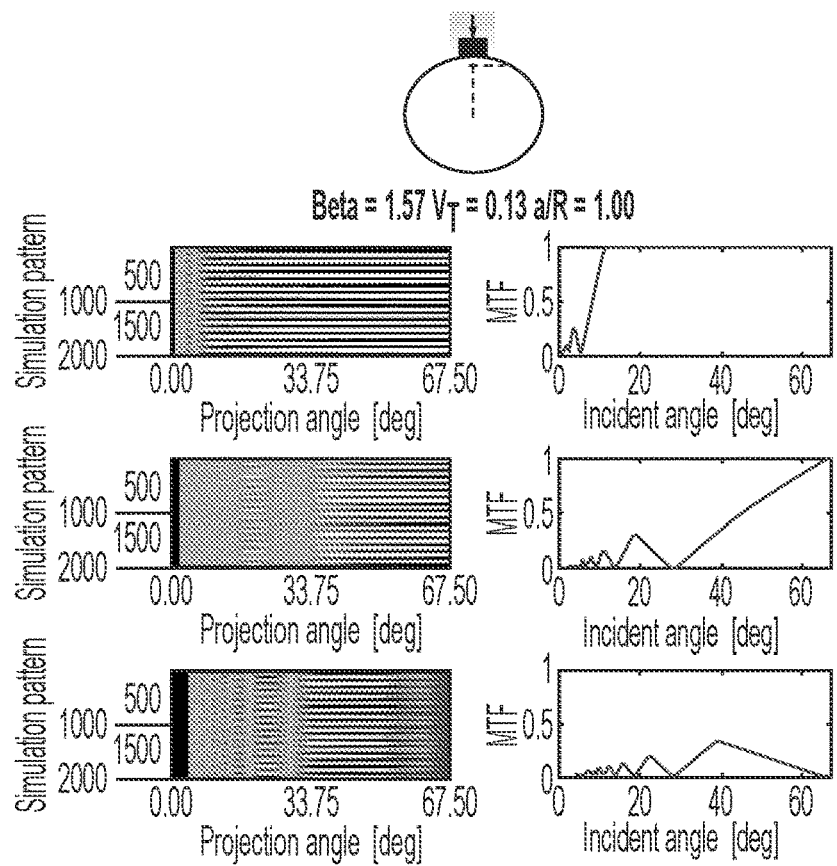

FIGS. 4A-4C depict a dose pattern and influence on the MTF, according to an embodiment of the present invention. The orientation of the pattern relative to the illumination direction influences the MTF. Additionally, as the minimum addressable optical spot size relative to the feature size increases the MTF decreases.

Figure 5:
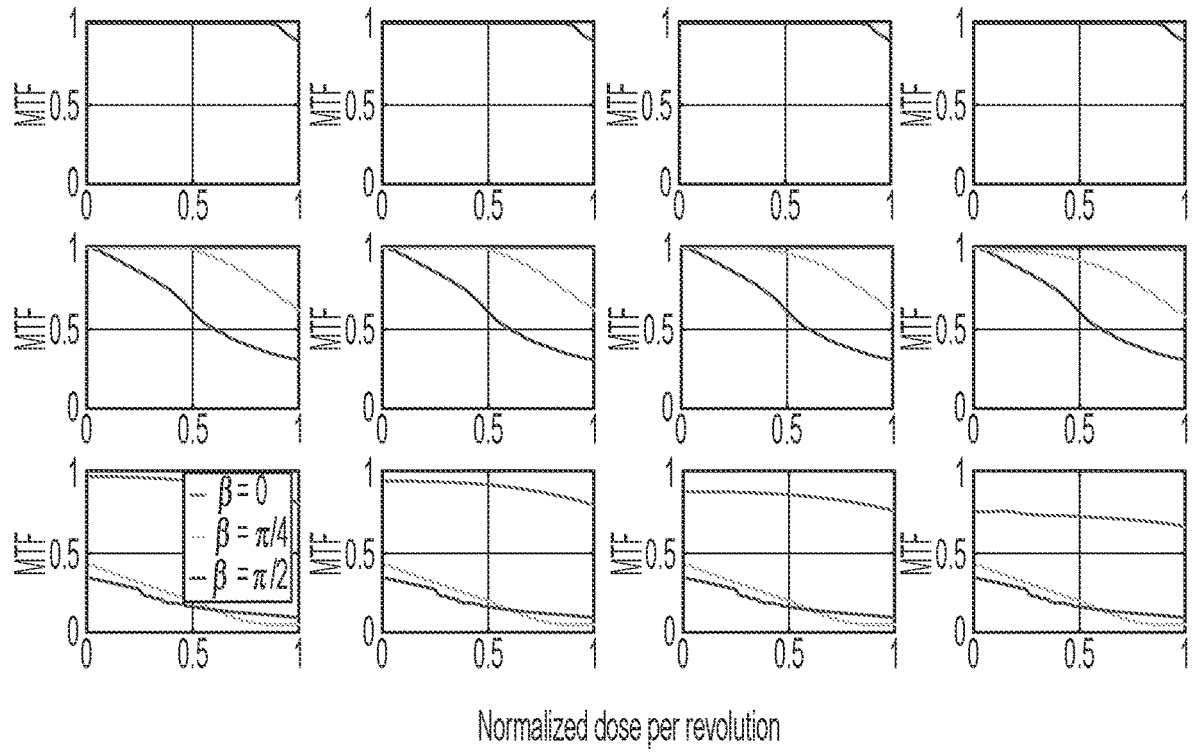
FIG. 5 depicts a cumulative light dose per revolution, according to an embodiment of the present invention.

FIG. 5 depicts a cumulative light dose per revolution, according to an embodiment of the present invention. The tangential velocity of the material on the roller relative to the static illumination influences the MTF. Increasing tangential velocity results in decreased MTF. The minimum addressable optical spot size relative to the feature size increases the MTF decreases. The X-axis represents the normalized dose per revolution with increasing tangential velocity of feature, and the Y-axis represents a change in pixel size ration d/p (see, FIG. 2B).

Figure 6:
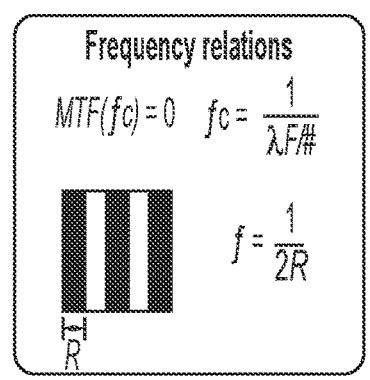
FIG. 6 shows a general MTF optical requirements of the system with minimum resolution of about 5 μm and wavelength of 405 nm, according to an embodiment of the present invention.

FIG. 6 shows a general MTF optical requirements of the system with minimum resolution of about 5 µm and wavelength of 405 nm, according to an embodiment of the present invention. For 5 µm resolution, the MTF≥0.4:

$$MTF(f_c) = 0$$

$$f_c = \frac{1}{\lambda F/\#}$$

$$f = \frac{1}{2R}$$

$$F/\# \leq \frac{2R\frac{f}{f_c}}{\lambda}$$

$$MTF\left(\frac{f}{f_c}\right) = \frac{2}{\pi}\left(\cos^{-1}\frac{f}{f_c} - \frac{f}{f_c}\left(1 - \left(\frac{f}{f_c}\right)^2\right)^{\frac{1}{2}}\right)$$

Figure 7:
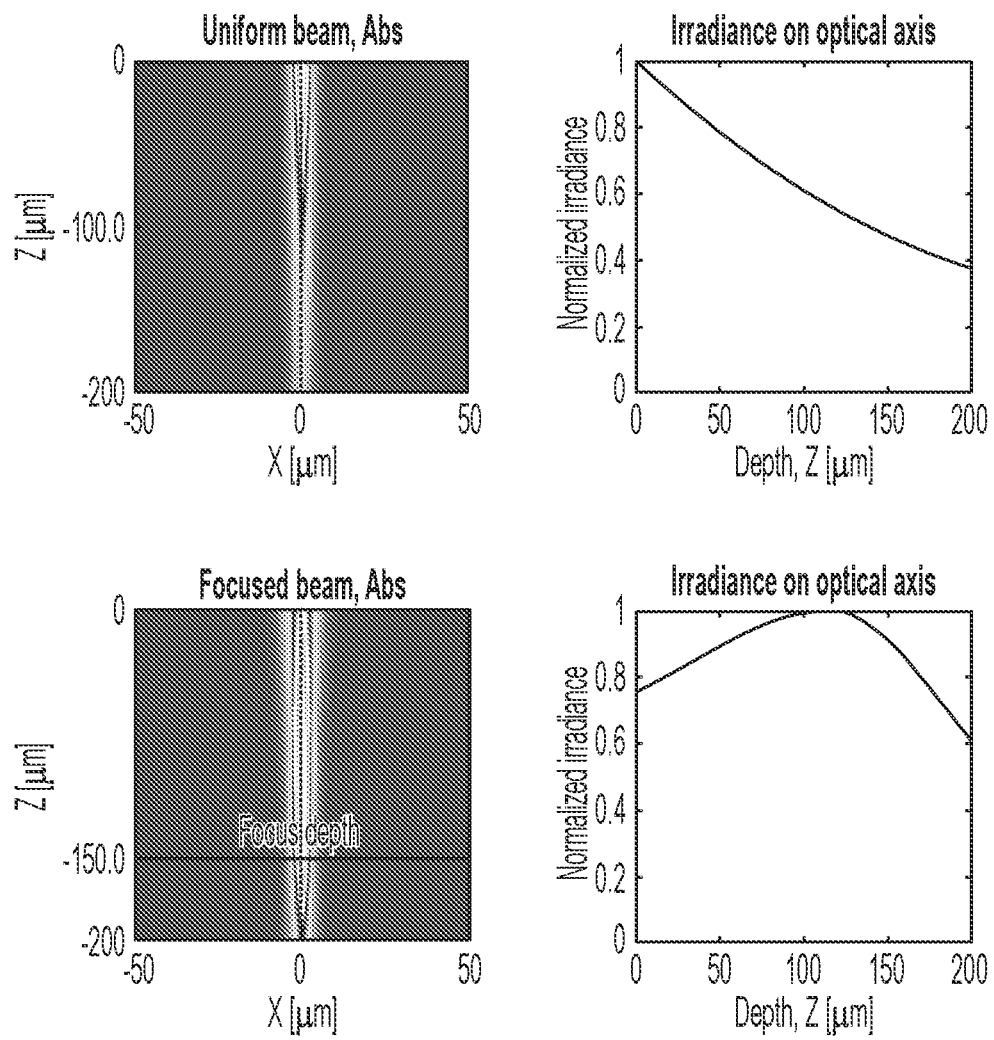
FIG. 7 depicts a variation of the irradiance within the material as a function of depth Z, according to an absorption model, according to an embodiment of the present invention.

FIG. 7 depicts a variation of the irradiance within the material as a function of depth Z, according to an absorption model, according to an embodiment of the present invention. Since the photosensitive material absorbs light, the irradiance within the material follows a decreasing exponential profile. A smaller attenuation a leads to more uniform irradiance. A beam focused in the material can also help achieve more uniform irradiance in the material as opposed to a lightly focused or nearly uniform beam. Model assumptions include illumination of DMD with laser, linear absorption with Beer-Lambert law, paraxial approximation, and Gaussian beam profile.

Figure 8A:
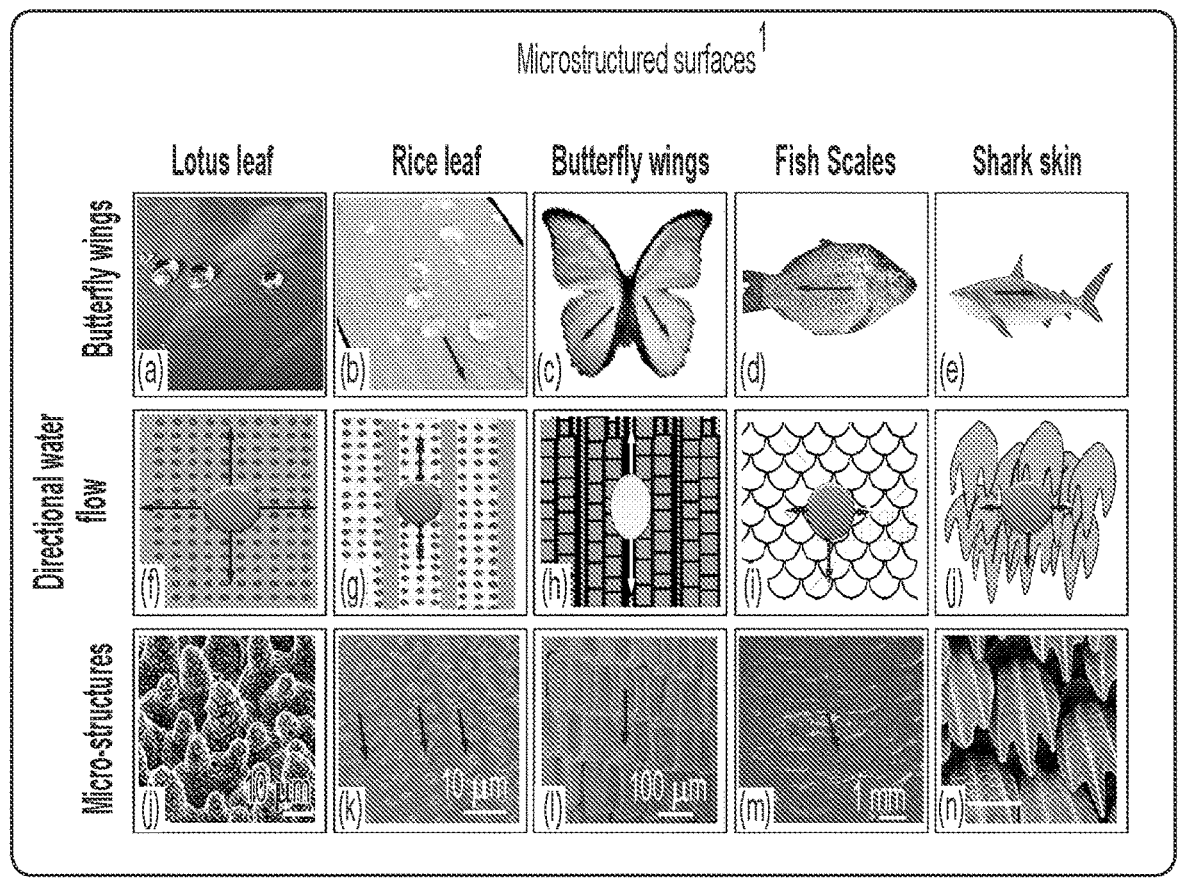
FIGS. 8A-8C show various printed structures including micro-structured surfaces, desalination feed spacers and mechanical metamaterials, according to various embodiments of the present invention.
Figure 8B:
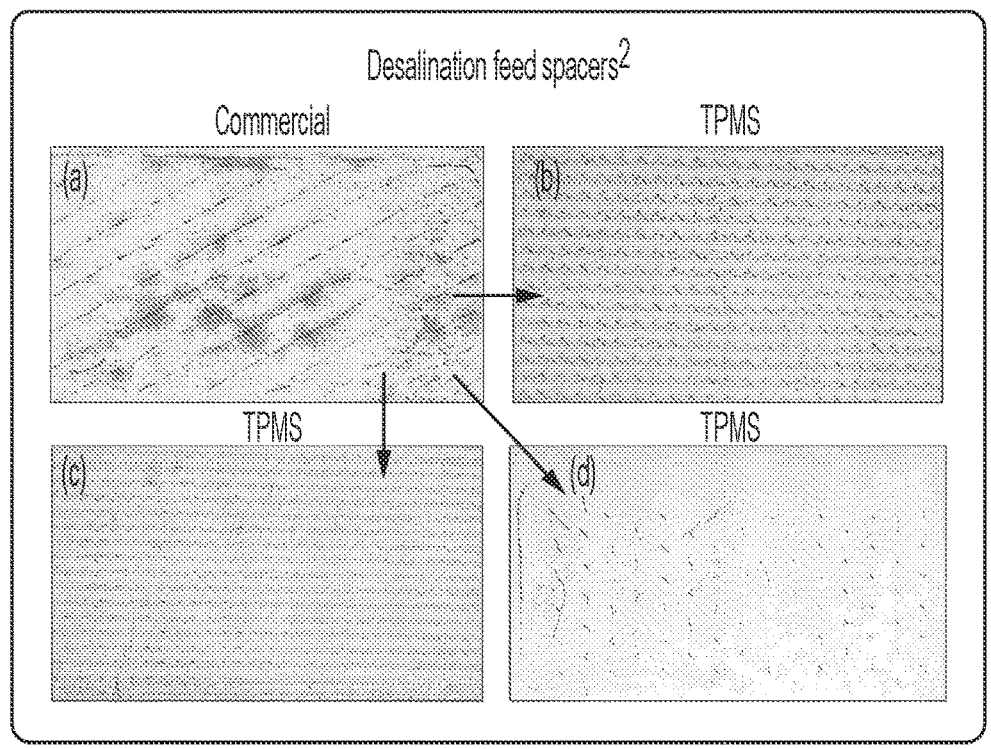
Figure 8C:
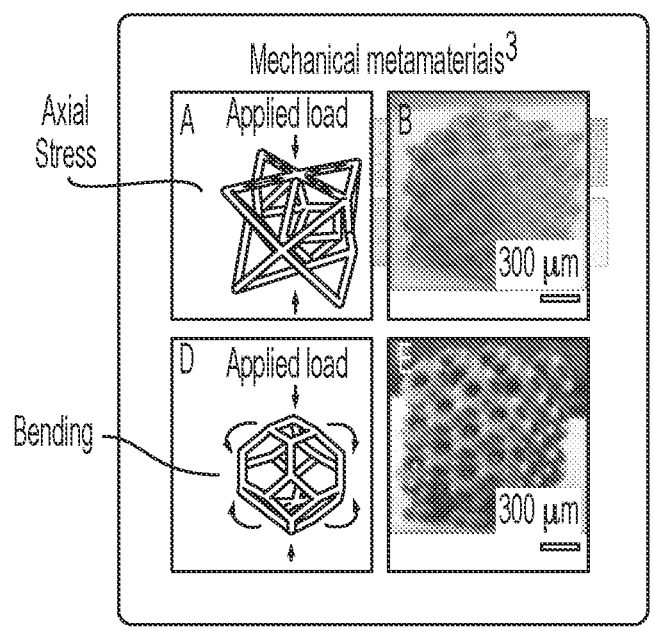

FIGS. 8A-8C show various printed structures including micro-structured surfaces, desalination feed spacers and mechanical metamaterials, according to various embodiments of the present invention. The Roll-to-Roll (R2R) system can produce 3D interior, reentrant, and hierarchical features with single (dynamic) exposure processing step.

Figure 9:
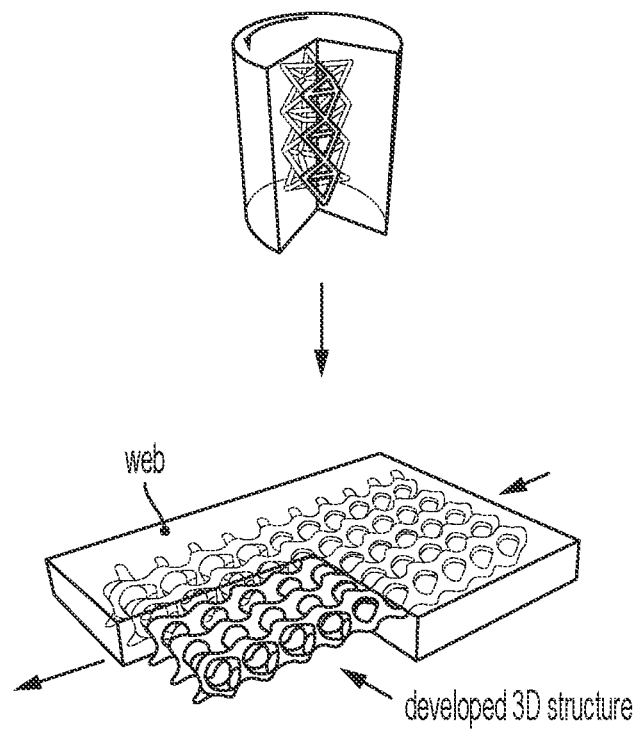
FIG. 9 shows a difference between a rotating cylindrical volume of photosensitive material and a thin film of material, according to an embodiment of the present invention.

FIG. 9 shows a difference between a rotating cylindrical volume of photosensitive material and a thin film of material, according to an embodiment of the present invention. Moving away from a rotating cylindrical volume of photosensitive material to a thin film of material presents challenges in achieving comparable angular exposure range. These challenges can be solved with a novel optomechanical system.

Figure 10:
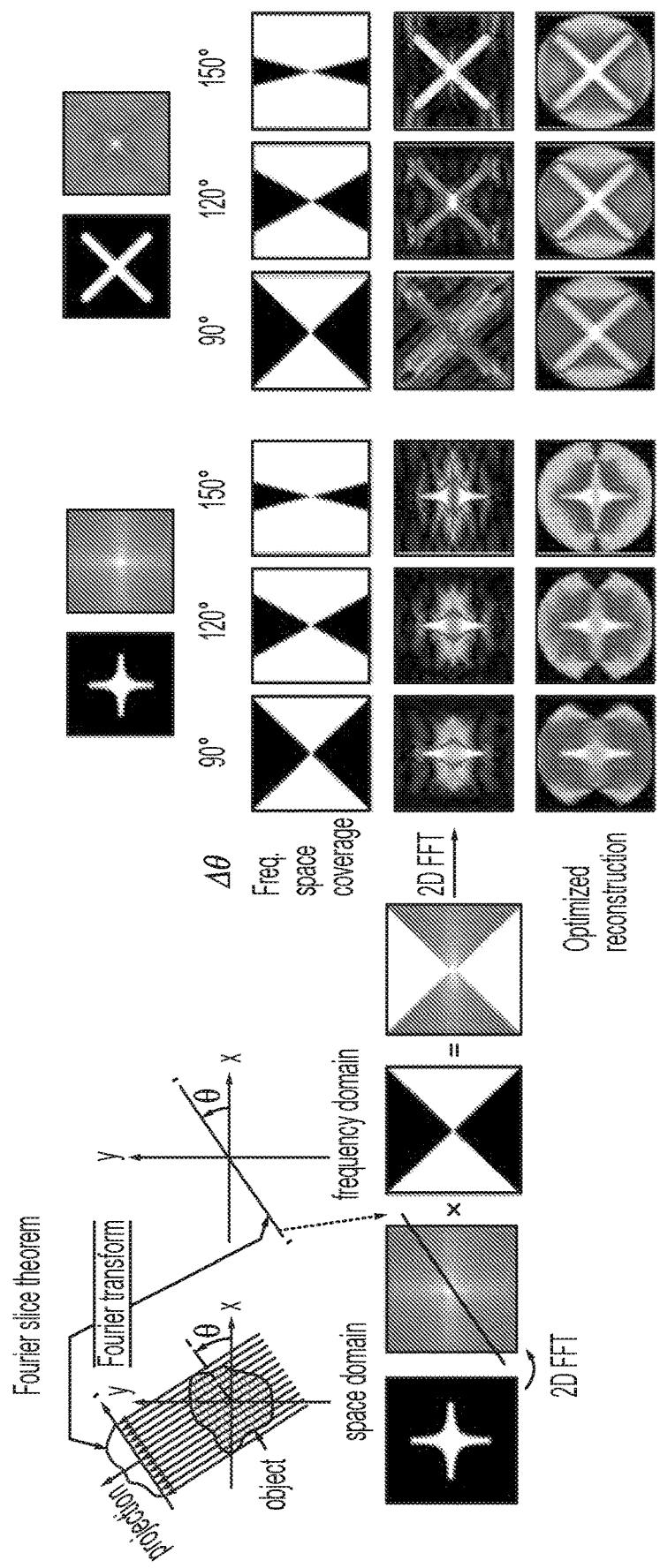
FIG. 10 shows a geometry of the Roll-to-Roll (R2R) system and range of exposure angles, according to various embodiments of the present invention.

FIG. 10 shows a geometry of the Roll-to-Roll (R2R) system and range of exposure angles, according to various embodiments of the present invention. Geometry of R2R CAL means that range of exposure angles could be limited to <180°. CAL is an acronym for computed axial lithography. This results in some limitations in geometric flexibility of patterning that arise from the Fourier slice theorem.

Figure 11A:
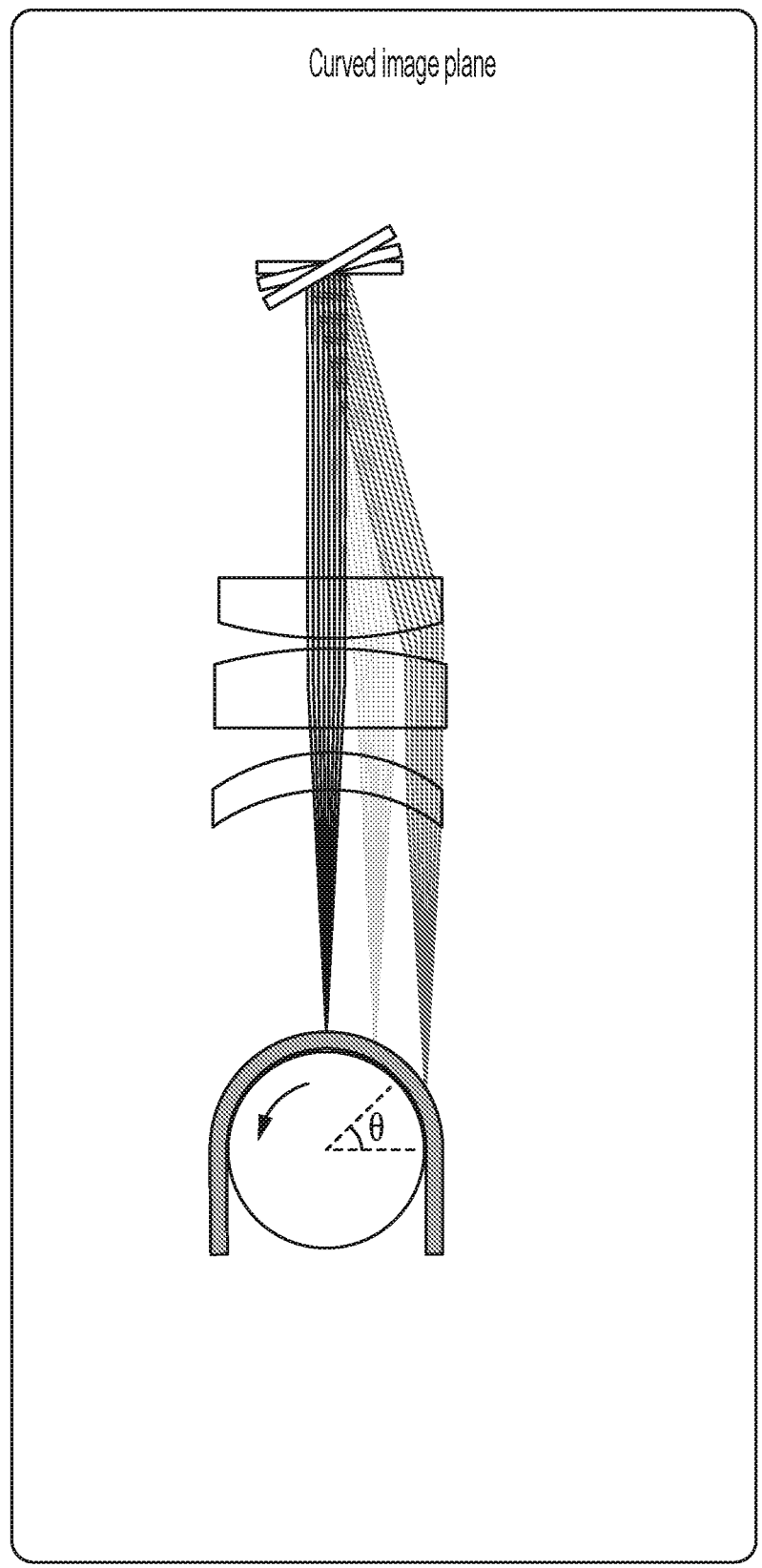
FIGS. 11A-11D shows various configurations of the optomechanical system of the present R2R CAL system, according to embodiments of the present invention.
Figure 11B:
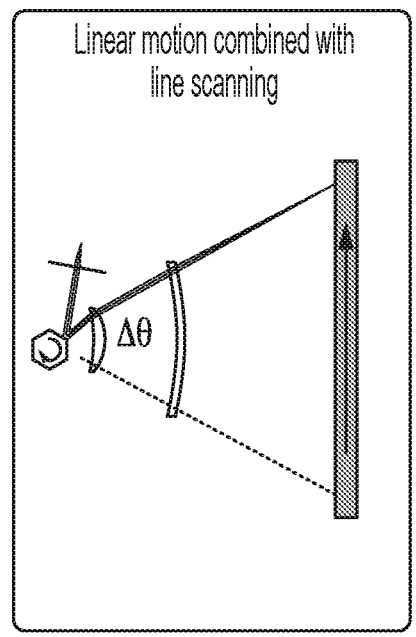
Figure 11C:
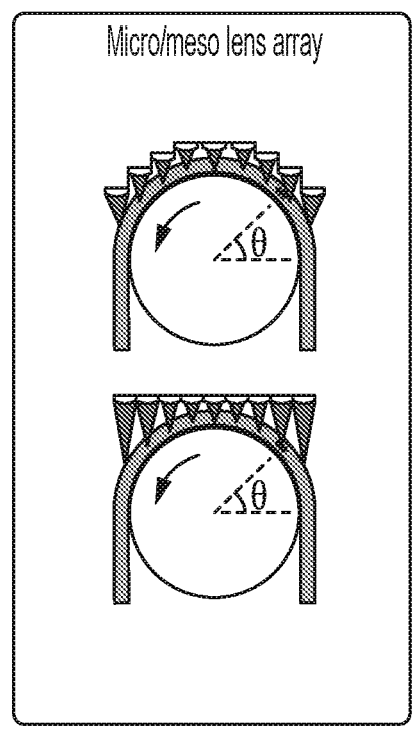
Figure 11D:
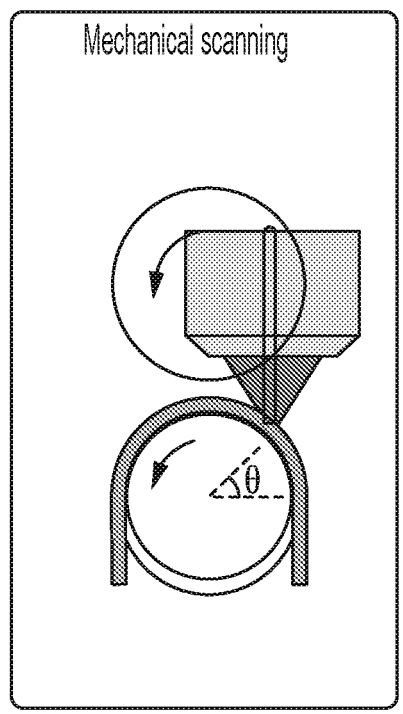

FIGS. 11A-11D shows various configurations of the optomechanical system of the present R2R CAL system, according to embodiments of the present invention. One goal of each configuration is to provide a means to expose the photosensitive material (material rolled around the rollers) to different light patterns at different angles relative to the surface of the material. Furthermore, the goal is to achieve large angular range close to 180° for the most geometric flexibility at the same time as offering high speed pattern scanning and high optical resolution. FIG. 11A shows the curved image plane. FIG. 11B shows linear motion in combination with line scanning. FIG. 11C shows micro/meso lens array to focus light on the web. FIG. 11D shows an example of mechanical scanning.

Figure 12:
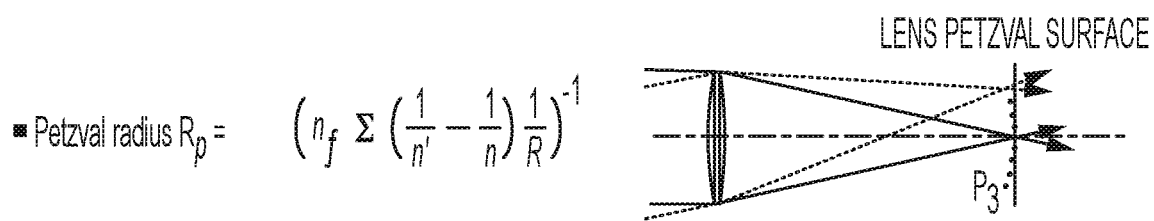
FIG. 12 shows a configuration where the image plane is curved, according to an embodiment of the present invention.

FIG. 12 shows a configuration where the image plane is curved, according to an embodiment of the present invention. The optical lens defines a lens Petzval surface Ps, shown in FIG. 12. The Petzval radius is defined by the following equation:

$$\text{Petzval radius } R_p = \left( n_f \sum \left( \frac{1}{n'} - \frac{1}{n} \right) \frac{1}{R} \right)^{-1}$$

Petzval curvature is the curvature of the focal plane of an optical system. In this system, the goal is to design an optical system which has a negative Petzval curvature that conforms to the roller. When the laser or DMD is scanned across the curved surface of the roller the focus remains close to the photosensitive material. Some benefits of using such system include a constant numerical aperture NA and depth of focus throughout the scan, the entire DMD plane can be projected onto the surface, and the optics are static (not moved) for the scanning element.

Figure 13:
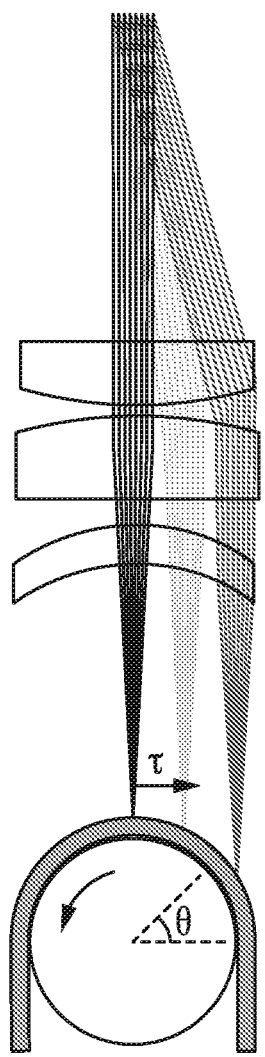
FIG. 13 shows the optical system and projection of light onto a curved plane/surface of the photosensitive material of the web, according to an embodiment of the present invention.

FIG. 13 shows the optical system and projection of light onto a curved plane/surface of the photosensitive material of the web, according to an embodiment of the present invention. The laser or DMD is scanned across the curved surface of the roller the focus remains close to the photosensitive material.

Figure 14:
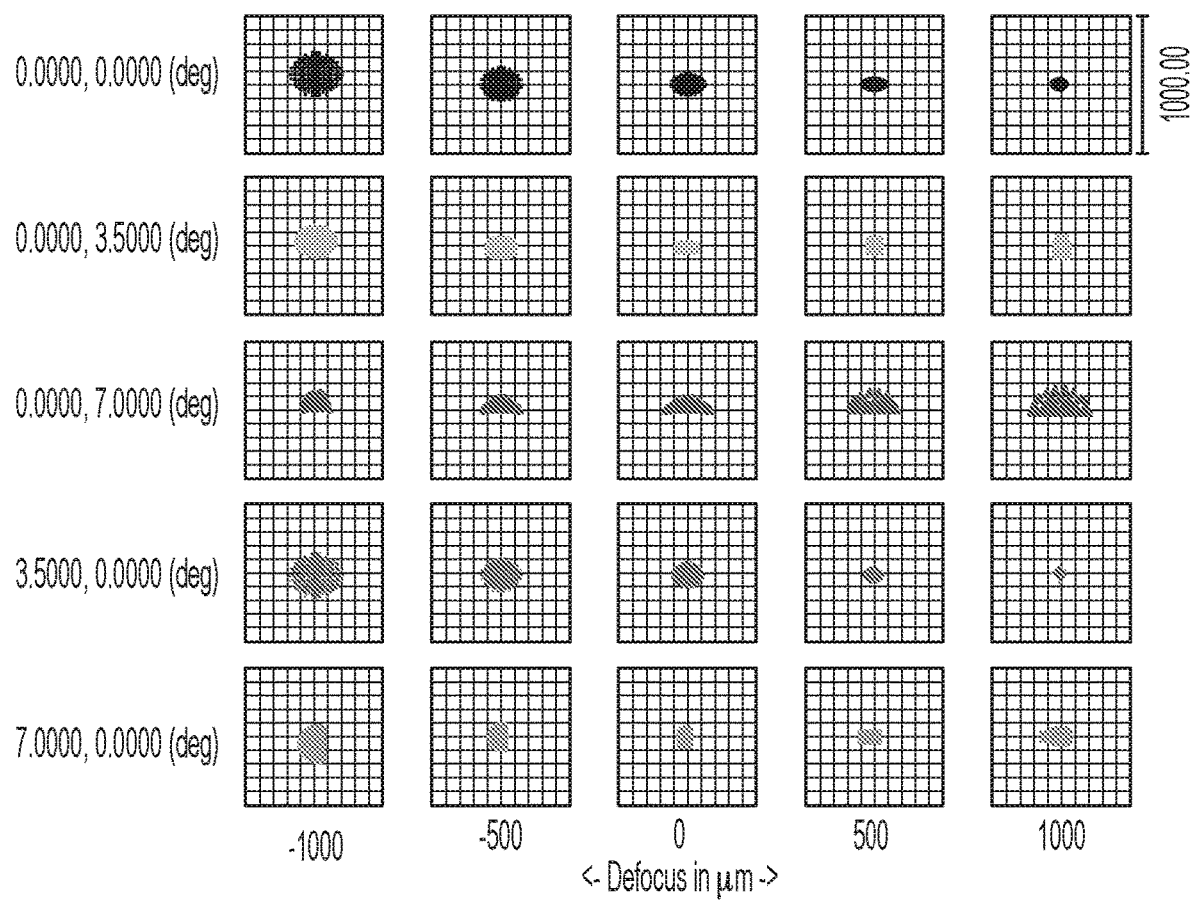
FIG. 14 shows the curved image plane of the laser and DMD scanning of the optical system, according to an embodiment of the present invention.
Figure 15:
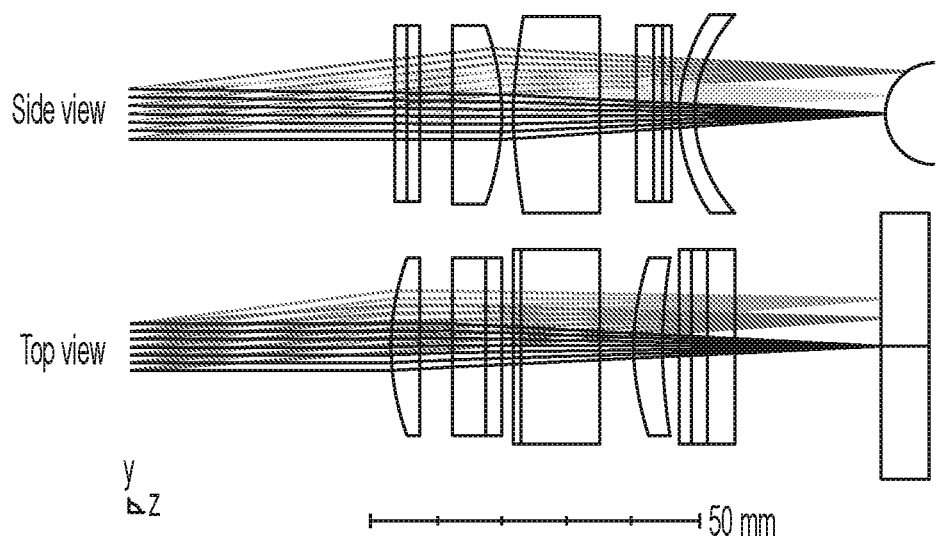
FIG. 15 shows a side view and a top view of optical system showing the light optical trajectory, according to an embodiment of the present invention.

FIG. 14 shows the curved image plane of the laser and DMD scanning of the optical system, according to an embodiment of the present invention. FIG. 15 shows a side view and a top view of optical system showing the light optical trajectory, according to an embodiment of the present invention. In an embodiment, the optical system is designed such that its Petzval curvature conforms to the surface of a roller. This configuration includes many challenges and may need many expensive cylindrical and acylindrical optical components.

Figure 16:
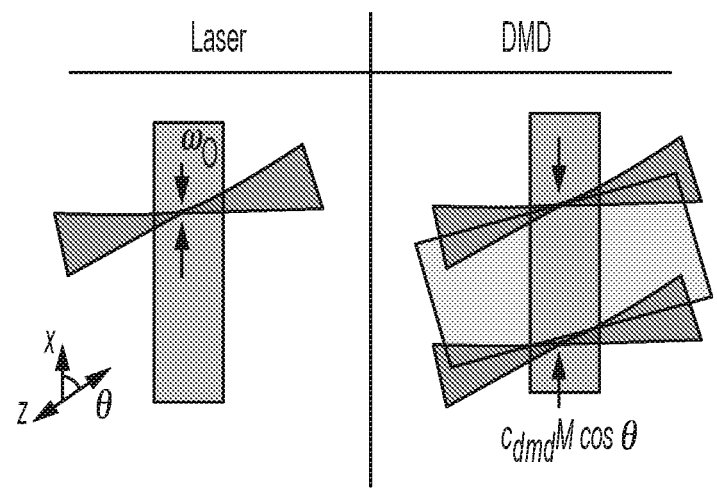
FIG. 16 shows laser and DMD configurations for a linear scan and linear web motion, according to embodiments of the present invention.

FIG. 16 shows laser and DMD configurations for a linear scan and linear web motion, according to embodiments of the present invention. For all systems, $f_d$ and the size and number of exposures govern the velocity of the web (either tangential when traversing a roller or linear velocity here). For larger NA (smaller minimum addressable optical spot size) and larger $N_\theta$ the velocity of the photosensitive material. A comparison between few parameters of the two configurations is provided in Table 1.

TABLE 1

| Laser | DMD |
|---|---|
| $v(\omega) = \frac{\lambda \omega N_f}{\pi^2 NA}$ | $v(f_d) = \frac{f_d c M}{N_\theta}$ |
| $\omega = \frac{2\pi f_d}{N_\theta N_f}$ | |
| $v(f_d) = \frac{2\lambda f_d}{\pi N_\theta NA}$ | |

Figure 17A:
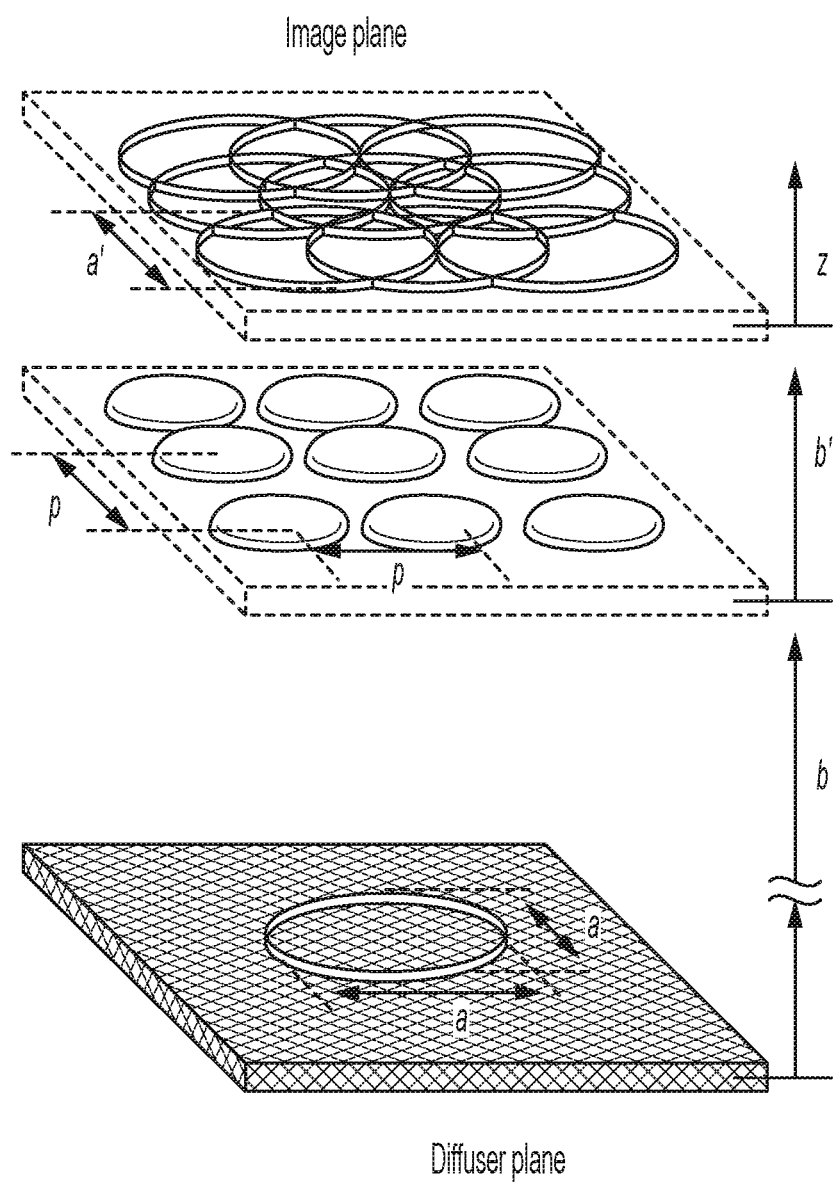
FIGS. 17A-17C depict an optical patterning process for stereolithography used for imaging patterns on the photosensitive material, according to an embodiment of the present invention.
Figure 17B:
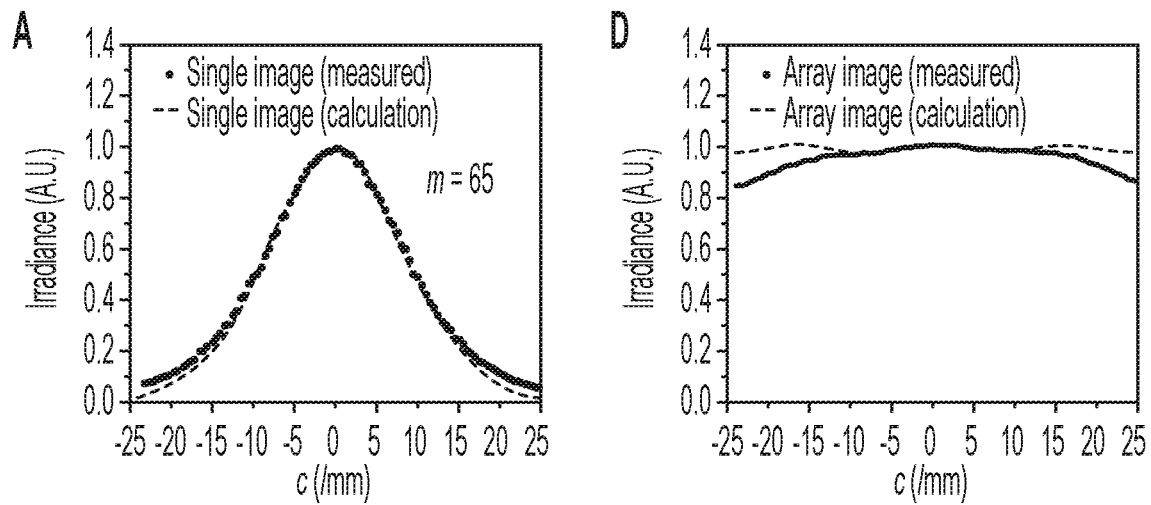
Figure 17B:
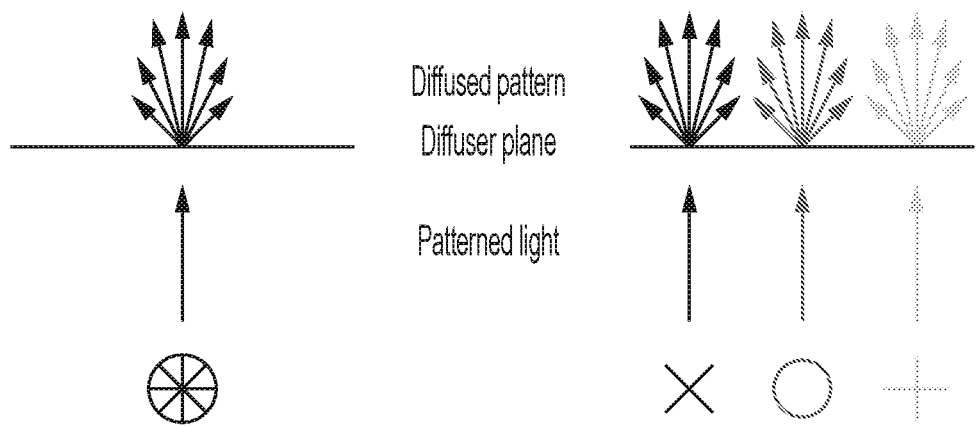
Figure 17C:
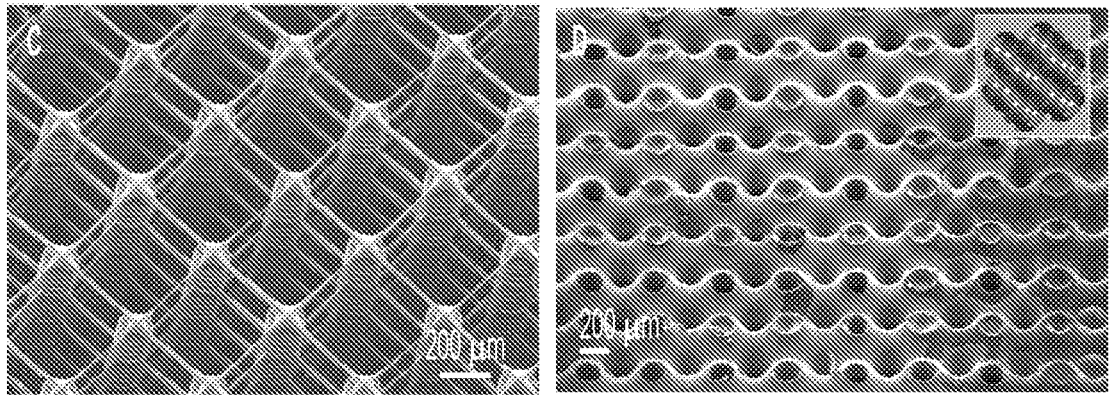

Where:
v=velocity of web
ω=polygon mirror angular velocity
λ=illumination wavelength
$N_f$=# of faces on polygon mirror
$N_\theta$=# of angular exposures per scan
NA=numerical aperture of scanning lens
$f_d$=pulse rate of laser or re fresh rate of DMD
M=DMD magnification
c=DMD width FIGS. 17A-17C depict an optical patterning process for stereolithography used for imaging patterns on the photosensitive material, according to an embodiment of the present invention. This optical process is adapted to R2R CAL for periodic image multiplication. FIG. 17 shows the image plane and diffuser plane to obtain a plurality of images or image pattern. FIG. 17B shows plots of the irradiance for a single image and for a plurality or an array of images along with a corresponding patterned light and diffused pattern. The left diagram in FIG. 17B shows a single diffused light while the right diagram in FIG. 17B shows a plurality of diffused images. One benefit of such an array of images is that an object can be decomposed and spread over similar length scales as the intended image thus allowing a multiplicity of images. FIG. 17C shows examples of microscope images of two different printed patterns showing a repetitive pattern.

Figure 18:
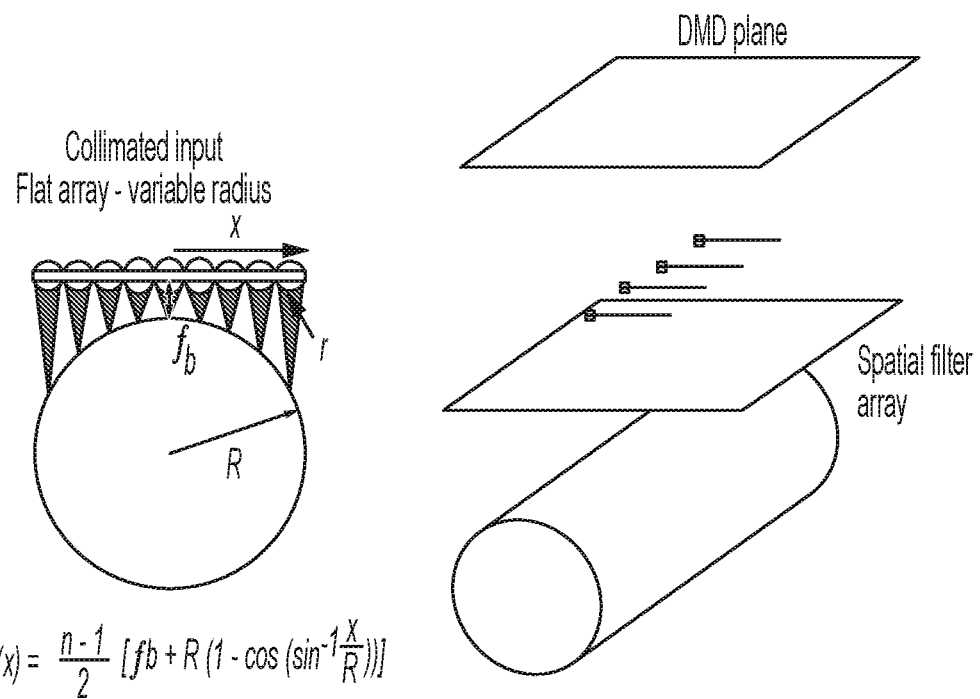
FIG. 18 shows an example of point-by-point scanning with a spatial filter array using a microlens array, according to an embodiment of the present invention.

FIG. 18 shows an example of point-by-point scanning with a spatial filter array using a microlens array, according to an embodiment of the present invention. Each lens in the microlens array focuses light to the intended portion of the photosensitive material. In an embodiment, the microlens array is located on a flat plane (i.e., flat array). The radius of each lens r(x) is selected according to a position x of the photosensitive material on the roller having a radius (R). The radius r(x) is given by the following equation.

$$r(x) = \frac{n-1}{2} \left[ f_b + R \left( 1 - \cos \left( \sin^{-1} \frac{x}{R} \right) \right) \right]$$

Figure 19:
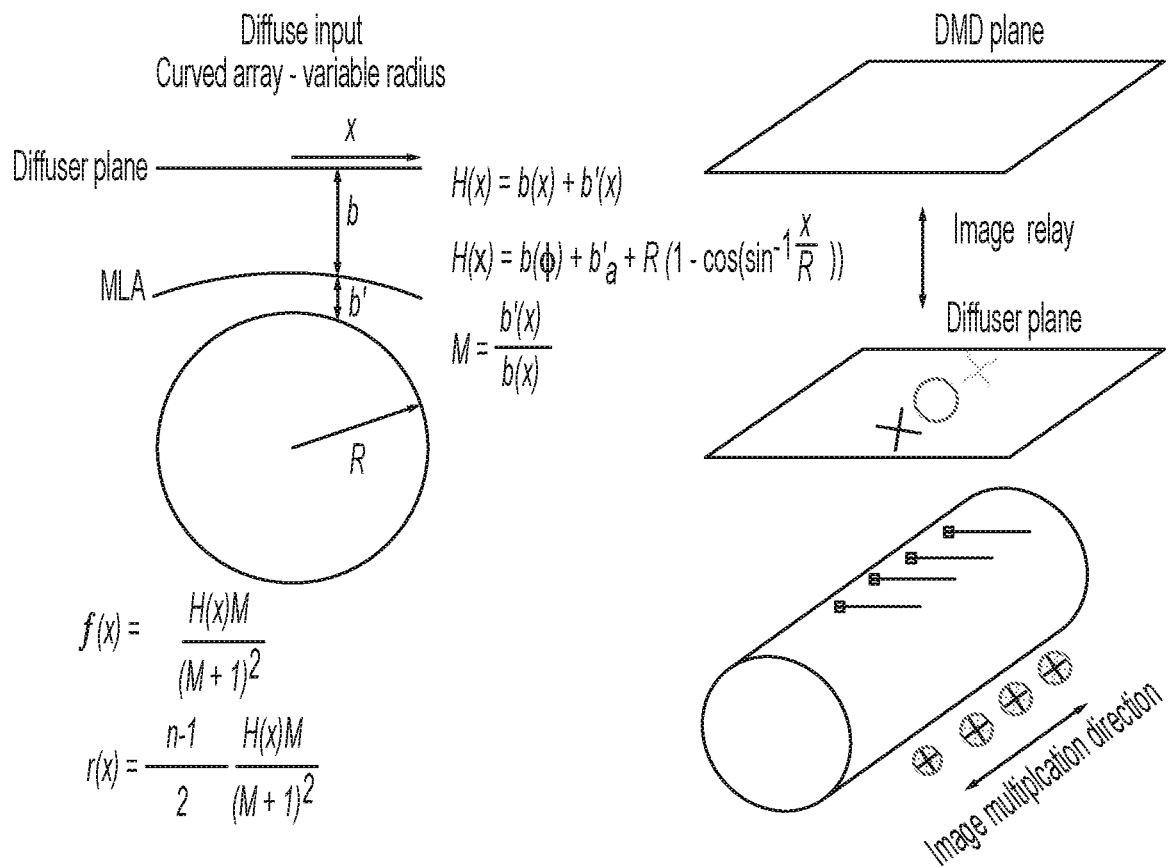
FIG. 19 is a schematic diagram of an integrated lithography image multiplication system, according to an embodiment of the present invention.

FIG. 19 is a schematic diagram of an integrated lithography image multiplication system, according to an embodiment of the present invention. As shown in FIG. 19, the integral lithography image multiplication system includes a curved microlens array for image formation that conforms to the surface of the roller and pattern temporal multiplexing as the substrate or photosensitive material traverses the face of the roller.

Figure 20A:
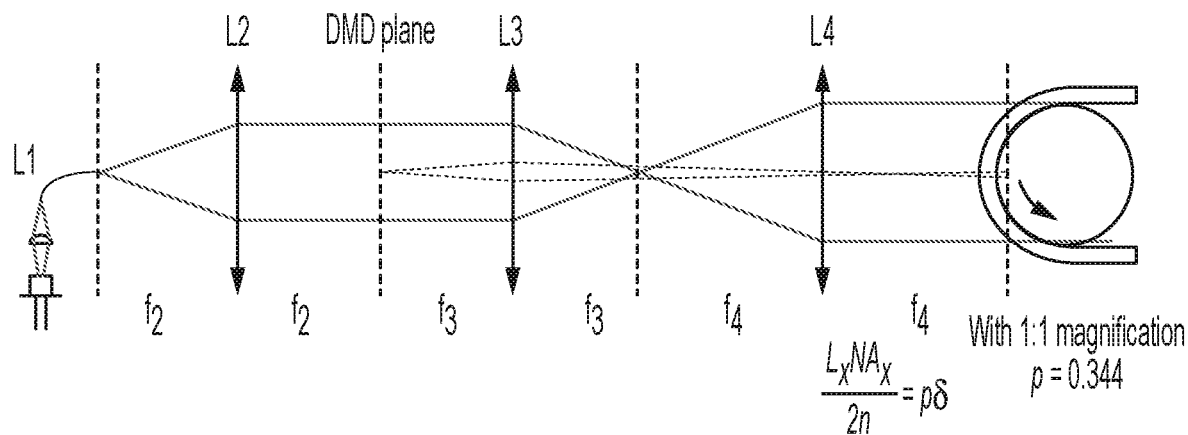
FIGS. 20A and 20B depict and optical system including a plurality of illumination sources and a single spatial modulator DMD, according to an embodiment of the present invention.
Figure 20B:
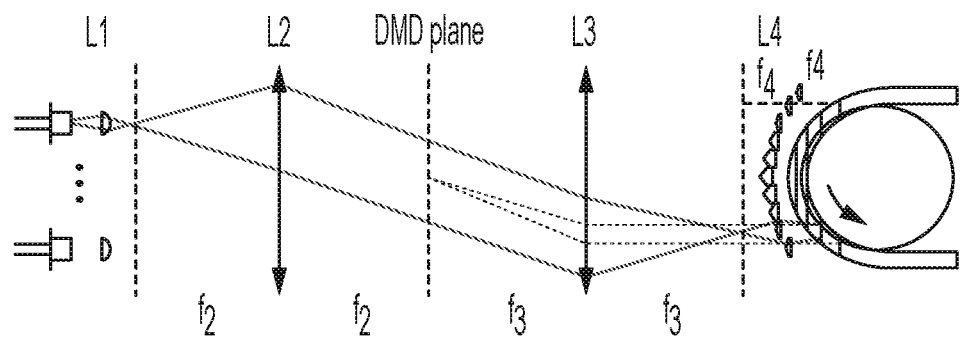

FIGS. 20A and 20B depict and optical system including a plurality of illumination sources and a single spatial modulator DMD, according to an embodiment of the present invention. The system which uses multiple illumination sources and a single spatial light modulator enables larger spatial bandwidth product as the DMD image need not be expanded to cover the whole diameter of the roller at once.

The photosensitive material can be spread on a film instead of contained in a cylindrical container. Therefore, in an embodiment, the photoresist material is provided as a solid material to resist motion during exposure. These are various options for solid-state photoresists. For example, a chemical with the following chemical formula can provide a dry film photoresist after soft baking the negative photoresist (e.g., SU-8).

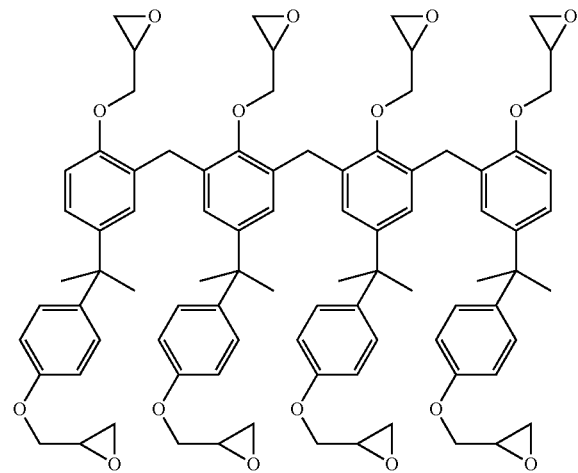 [SMILES: CC(C)(c1ccc(OCC2CO2)cc1)c1ccc(OCC2CO2)c(Cc2cc(C(C)(C)c3ccc(OCC4CO4)cc3)cc(Cc3cc(C(C)(C)c4ccc(OCC5CO5)cc4)cc(Cc4cc(C(C)(C)c5ccc(OCC6CO6)cc5)ccc4OCC4CO4)c3OCC3CO3)c2OCC2CO2)c1]

Figure 21:
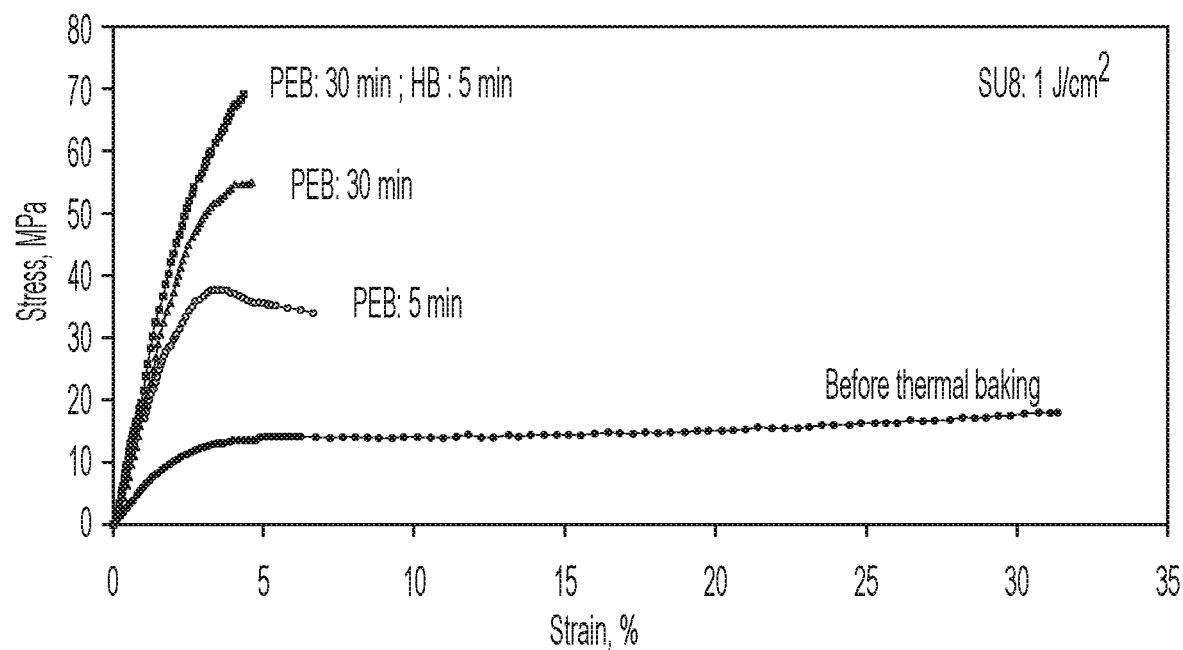
FIG. 21 is a plot of the stress versus strain on the material before and after thermal baking with different periods of time, according to an embodiment of the present invention.

FIG. 21 is a plot of the stress versus strain on the material before and after thermal baking with different periods of time, according to an embodiment of the present invention. Before thermal baking the stress in MPa remains constant with increasing strain in percent (%). After baking a certain period of time, the stress increases exponentially with the amount of strain.

Figure 22:
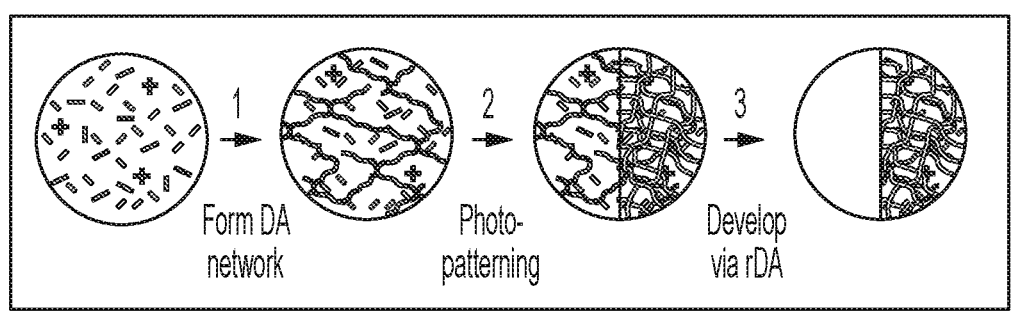
FIG. 22 depicts a flow chart of a process of photo-patterning a photosensitive material, according to an embodiment of the present invention.

FIG. 22 depicts a flow chart of a process of photo-patterning a photosensitive material, according to an embodiment of the present invention. Starting with the photosensitive material, a network is formed using photopatterning and then the material is developed to remove the non-exposed photosensitive material.

Figure 23A:
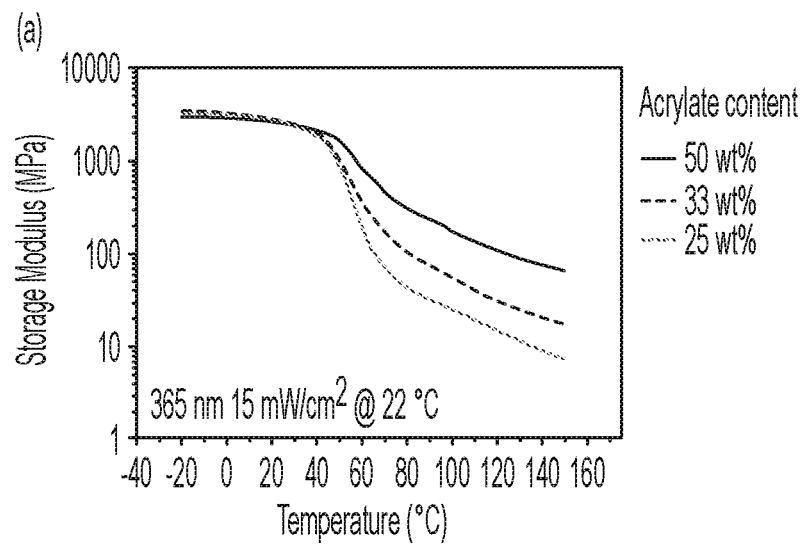
FIGS. 23A and 23B are plots of storage modulus versus temperature for various acrylates content in the photoresist and various exposure temperature, according to embodiments of the present invention.
Figure 23B:
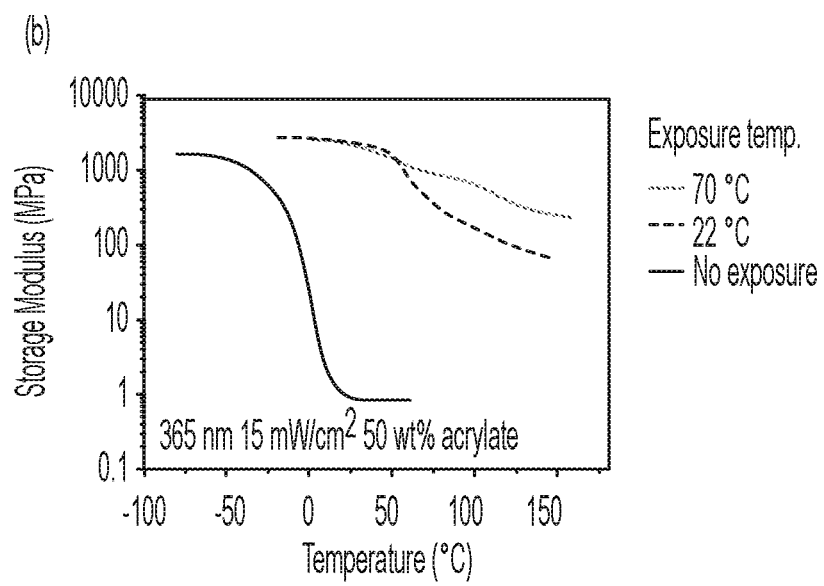

FIGS. 23A and 23B are plots of storage modulus versus temperature for various acrylates content in the photoresist and various exposure temperature, according to embodiments of the present invention. Various acrylate monomer can be used for the photoresist. The acrylate is miscible in Diels-Alder (DA) solution, a combination of an acrylate monomer and a photoinitiator. Photoresist can be thermally solidified with one thermo-reversible network and later photo-fixated with light exposure. The material has dual-cure functionality such that a thermo-reversible DA network can be formed independently from the acrylate by a thiol-ene reaction by a certain heating profile. This thiol-ene reaction forms a solid containing the DA network and the liquid acrylate monomer. Then, the chain growth acrylate network can be formed later by photopolymerization, "photo-fixating" the thermo-reversible DA network. In the development procedure, the material is heated which causes the retro-DA reaction of material that was unexposed to light and subsequently, the dissolution of the DA monomer combination in the developer solution. The photo-fixation prevents the exposed material from undergoing the retro-DA reaction and thus is unaffected by developer solution.

The following examples describe some concepts of the current invention in detail for particular embodiments. However, the general concepts of the current invention are not limited to these specific examples.

Figure 24A:
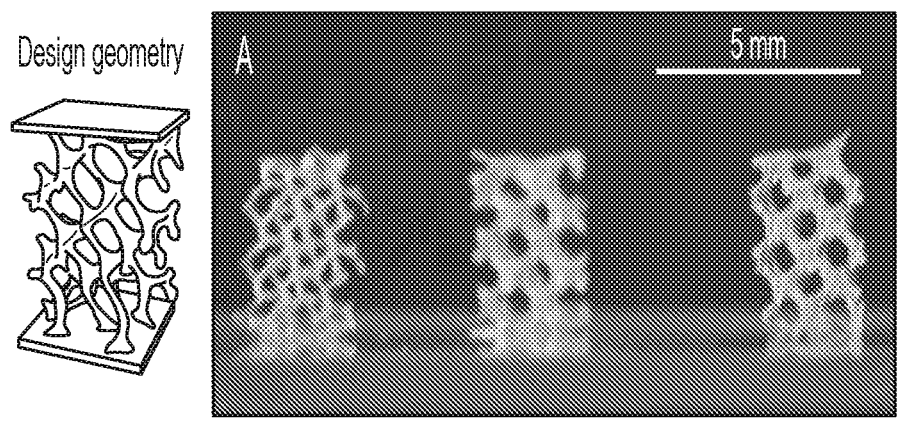
FIG. 24A shows a diagram of preliminary experiments demonstrating that CAL is capable of high-resolution patterning of Triply Periodic Minimal Surface Structures (TPMS), according to an embodiment of the present invention.

EXAMPLES: Some applications can include a roll-to-roll additive manufacturing testbed for continuous production of large sheets of complex 3D micro scale structures. The system may take advantage of the tomographic patterning and rotation of the photoactive resin in computed axial lithography (CAL). Large arrays of periodic microstructures can be used for mechanical meta structures, scaffolds for 3D cell culturing, and Spiral Wound Membrane (SWM) feed spacers for reverse osmosis. FIG. 24A shows a diagram of preliminary experiments demonstrating that CAL is capable of high-resolution patterning of Triply Periodic Minimal Surface Structures (TPMS), according to an embodiment of the present invention. TPMS is shown to exhibit improved flow characteristics and reduced biofouling in SWM desalination.

Figure 24B:
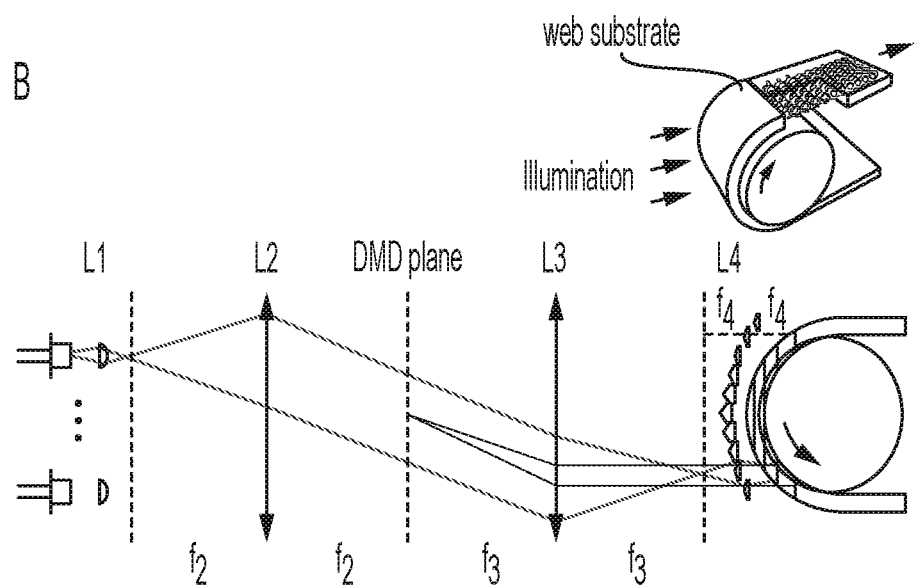
FIG. 24B depicts a roll-to-roll (R2R) configuration where the substrate is coated before passing over a roller where optical patterning will take place, according to an embodiment of the present invention.

FIG. 24B depicts a roll-to-roll (R2R) configuration where the substrate is coated before passing over a roller where optical patterning will take place, according to an embodiment of the present invention. The substrate's tangential path provides rotation relative to the projected light, exposing patterns through a range ≤180°. Several candidate materials have been identified that can be patterned while in solid phase to prevent liquid film flow during processing (Table 2). SWM spacers experience interlayer pressures of 0.1-0.2 MPa and 10 MPa localized contact pressures during use, thus mechanical properties of the candidate materials must be assessed.

TABLE 2

Candidate solid-phase photoresists

| Material | SU-8 ® photoresist | Dry film photoresist (SUEX ®) | Chilled viscous monomer | Diels-Alder/ Acrylate mixture |
| --- | --- | --- | --- | --- |
| Modulus (GPa) | 2-4 | 3.9 | ~2 | ~2 |
| Tensile strength (MPa) | 49-77 | 86 | ~90 | NA |
| Wavelength range (nm) | 365-395 | 365-395 | variable | variable |

While various embodiments of the present invention have been described above, it should be understood that they have been presented by way of example only, and not limitation. Thus, the breadth and scope of the present invention should not be limited by any of the above-described illustrative embodiments, or following examples, but should instead be defined only in accordance with the following claims and their equivalents.

The embodiments illustrated and discussed in this specification are intended only to teach those skilled in the art how to make and use the invention. In describing embodiments of the disclosure, specific terminology is employed for the sake of clarity. However, the disclosure is not intended to be limited to the specific terminology so selected. The above-described embodiments, and following examples, may be modified or varied, without departing from the invention, as appreciated by those skilled in the art in light of the above teachings. It is therefore to be understood that, within the scope of the claims and their equivalents, the invention may be practiced otherwise than as specifically described. For example, it is to be understood that the present disclosure contemplates that, to the extent possible, one or more features of any embodiment can be combined with one or more features of any other embodiment.

We claim:

1. A roll-to-roll computed axial lithography system, comprising:
   an optical illumination system;
   an optical modulation system arranged to receive light from said optical illumination system and being further configured to output a spatially and temporally modulated illumination pattern of light; and
   a web-handling system configured to receive and transport a web such that a portion of said web will be in an optical path of said optical modulation system at an instant of time during operation, said web comprising a layer of photosensitive material,
   wherein said web-handling system comprises a development module arranged to render three-dimensional structures from said layer of photosensitive material that has been exposed to said spatially and temporally modulated illumination pattern of light,
   wherein said spatially and temporally modulated illumination pattern of light provides predetermined three-dimensional regions within a bulk of said layer of photosensitive material that are exposed beyond a photo-responsive threshold for said photosensitive material providing a volumetric patterning, and
   wherein said development module removes one of regions of said layer of said photosensitive material that are exposed beyond said photo-responsive threshold or regions of said layer of photosensitive material that are not exposed beyond said photo-responsive threshold to provide a three-dimensional structure from said layer of said photosensitive material.

2. The roll-to-roll computed axial lithography system according to claim 1, wherein said development module comprises a liquid processing system to at least one of rinse or spray said layer of photosensitive material with a developer solvent.

3. The roll-to-roll computed axial lithography system according to claim 1, wherein said development module comprises a heating system to apply heat to said layer of photosensitive material after being exposed to said spatially and temporally modulated illumination pattern of light.

4. The roll-to-roll computed axial lithography system according to claim 1, wherein said web-handling system further comprises a coating module configured to deposit said layer of photosensitive material onto a flexible substrate.

5. The roll-to-roll computed axial lithography system according to claim 1, wherein said optical illumination system comprises a single laser, and wherein said optical modulation system comprises an array of electromechanically switchable micromirrors.

6. The roll-to-roll computed axial lithography system according to claim 5, wherein said optical illumination system further comprises a square core multimode fiber arranged such that light from said single laser is coupled therein, said square core multimode fiber providing spatially homogenized output light.

7. The roll-to-roll computed axial lithography system according to claim 6, wherein said optical illumination system further comprises a beam expanding lens system arranged between a light output end of said square core multimode fiber and said optical modulation system.

8. The roll-to-roll computed axial lithography system according to claim 5, wherein said array of electromechanically switchable micromirrors are pulse width modulated, and wherein said array of electromechanically switchable micromirrors have a refresh rate set in accordance with a speed of said web passing through a roller assembly of said web-handling system.

9. The roll-to-roll computed axial lithography system according to claim 5, further comprising an optical imaging system arranged between said optical modulation system and a roller assembly of said web-handling system, wherein said optical imaging system is constructed to compensate for said layer of said photosensitive material forming a curved imaging surface rather than a flat imaging plane.

10. The roll-to-roll computed axial lithography system according to claim 9, wherein said optical imaging system comprises:
    a mirror arranged to reflect said spatially and temporally modulated illumination pattern of light to provide a reflected spatially and temporally modulated illumination pattern of light;
    a telecentric scanning lens system arranged to receive said reflected spatially and temporally modulated illumination pattern of light to be output to provide said volumetric patterning of said layer of photosensitive material; and
    fluid container having a transparent and substantially planar surface through which said reflected spatially and temporally modulated illumination pattern of light output from said telecentric scanning lens system,
    wherein said fluid container is configured to hold a fluid with an index of refraction that is substantially matched to an index of refraction of said layer of photosensitive material,
    wherein said fluid container is further configured to immerse said portion of said web in said fluid during said volumetric patterning, and
    wherein said telecentric scanning lens system comprises an electrically tunable lens and a galvanometric mirror.

11. The roll-to-roll computed axial lithography system according to claim 1, wherein said optical illumination system comprises a plurality of lasers, each of said plurality of lasers arranged at different angles such that said optical modulation system is configured to project spatially offset exposure patterns onto said layer of photosensitive material.

12. The roll-to-roll computed axial lithography system according to claim 1, wherein said three-dimensional structure has submillimeter lithographically produced substructures.

13. The roll-to-roll computed axial lithography system according to claim 1, wherein said three-dimensional structure has lithographically produced substructures that are less than 100 micrometers.

14. The roll-to-roll computed axial lithography system according to claim 1, wherein said three-dimensional structure has lithographically produced substructures that are less than 10 micrometers.

15. A roll-to-roll computed axial lithography method, comprising:
    providing a spatially and temporally modulated illumination pattern of light;
    passing a web through said spatially and temporally modulated illumination pattern of light to expose a layer of photosensitive material of said web to said spatially and temporally modulated illumination pattern of light, said spatially and temporally modulated illumination pattern of light provides predetermined three-dimensional regions within a bulk of said layer of photosensitive material that are exposed beyond a photo-responsive threshold for said photosensitive material providing a volumetric patterning; and developing said exposed layer of photosensitive material subsequent to said passing through said spatially and temporally modulated illumination pattern of light to render three-dimensional structures from said layer of photosensitive material that has been exposed to said spatially and temporally modulated illumination pattern of light; and removing one of regions of said layer of said photosensitive material that are exposed beyond said photo-responsive threshold or regions of said layer of photosensitive material that are not exposed beyond said photo-responsive threshold to provide a three-dimensional structure from said layer of said photosensitive material.

16. The roll-to-roll computed axial lithography method according to claim 15, wherein the three-dimensional structure has submillimeter lithographically produced substructures.

17. The roll-to-roll computed axial lithography method according to claim 15, wherein the three-dimensional structure has lithographically produced substructures that are less than 100 micrometers.

18. The roll-to-roll computed axial lithography method according to claim 15, wherein the three-dimensional structure has lithographically produced substructures that are less than 10 micrometers.

* * * * *